(12) United States Patent
Ayzenberg et al.

(10) Patent No.: US 11,705,649 B2
(45) Date of Patent: Jul. 18, 2023

(54) HIGH PERFORMANCE CABLE TERMINATION

(71) Applicant: Amphenol Corporation, Wallingford, CT (US)

(72) Inventors: Mark M. Ayzenberg, Hudson, NH (US); Khwajahussain Gadwal Mohammed, Nashua, NH (US); Erdem Matoglu, Stratham, NH (US); Catalin Muntean, Nashua, NH (US)

(73) Assignee: Amphenol Corporation, Wallingford, CT (US)

( * ) Notice: Subject to any disclaimer, the term of this patent is extended or adjusted under 35 U.S.C. 154(b) by 0 days.

(21) Appl. No.: 17/574,914

(22) Filed: Jan. 13, 2022

(65) Prior Publication Data
US 2022/0140505 A1 May 5, 2022

Related U.S. Application Data

(63) Continuation of application No. 16/716,176, filed on Dec. 16, 2019, now Pat. No. 11,228,123.
(Continued)

(51) Int. Cl.
*H05K 1/11* (2006.01)
*H01R 12/53* (2011.01)
(Continued)

(52) U.S. Cl.
CPC ......... *H01R 12/53* (2013.01); *H01R 13/6471* (2013.01); *H01R 13/6581* (2013.01);
(Continued)

(58) Field of Classification Search
CPC .............................................. H05K 1/11–119
See application file for complete search history.

(56) References Cited

U.S. PATENT DOCUMENTS 6,428,327 B1 8/2002 Tamarkin et al.
6,832,931 B1 12/2004 Wu
(Continued)

FOREIGN PATENT DOCUMENTS

CN 102823070 A 12/2012
CN 103000262 A 3/2013
(Continued)

OTHER PUBLICATIONS

PCT/US2016/022465, Jun. 29, 2016, International Search Report and Written Opinion.
(Continued)

*Primary Examiner* — Jeremy C Norris
(74) *Attorney, Agent, or Firm* — Wolf, Greenfield & Sacks, P.C.

(57) ABSTRACT

A cable assembly comprising a connector with a termination that enables high density and high signal integrity. Shields of cables are terminated to a paddle card via a conductive structure attached to a surface of the paddle card. The signal conductors of the cables are terminated to pads on the paddle card that are exposed within openings of the conductive structure. Such a structure creates a ground structure per cable that provides low insertion loss and low crosstalk, even when multiple cables are aligned side by side and terminated in one or more rows. The cables may be drainless, enabling a large number of cables, such as eight cables, to be packed within the width of a paddle card specified in high density standards such as QSFP-DD or OSFP. The cables may nonetheless have large diameter signal conductors, enabling 2.5 or 3 meter assemblies with less than 17 dB insertion loss.

22 Claims, 17 Drawing Sheets

Related U.S. Application Data

(60) Provisional application No. 62/780,504, filed on Dec. 17, 2018.

(51) Int. Cl.
*H01R 13/6592* (2011.01)
*H01R 13/6471* (2011.01)
*H01R 13/6581* (2011.01)
*H01R 13/6594* (2011.01)

(52) U.S. Cl.
CPC ..... *H01R 13/6592* (2013.01); *H01R 13/6594* (2013.01); *H05K 1/117* (2013.01); *H05K 2201/10356* (2013.01)

(56) References Cited

U.S. PATENT DOCUMENTS

| | | |
|---|---|---|
| 7,267,575 B1 | 9/2007 | Hwang |
| 7,364,465 B2 | 4/2008 | Wu |
| 7,497,724 B1 | 3/2009 | Fong et al. |
| 7,507,127 B2 | 3/2009 | Nagata et al. |
| 7,857,657 B2 | 12/2010 | Kuwahara et al. |
| 7,906,730 B2 | 3/2011 | Atkinson et al. |
| 8,011,950 B2 | 9/2011 | McGrath et al. |
| 8,018,733 B2 | 9/2011 | Jia |
| 8,235,731 B1 | 8/2012 | Poulsen et al. |
| 8,840,432 B2 | 9/2014 | Alden, III et al. |
| 8,845,364 B2 | 9/2014 | Wanha et al. |
| 8,878,062 B2 | 11/2014 | Tanaka et al. |
| 8,900,007 B2 | 12/2014 | Nonen et al. |
| 9,011,177 B2 | 4/2015 | Lloyd et al. |
| 9,028,281 B2 | 5/2015 | Kirk et al. |
| 9,231,393 B2 | 1/2016 | Buck et al. |
| 9,306,334 B2 | 4/2016 | Zhu |
| 9,373,915 B1 | 6/2016 | Schulz et al. |
| 9,484,689 B2 | 11/2016 | Wu et al. |
| 9,545,040 B2 | 1/2017 | Garman et al. |
| 9,583,887 B2 | 2/2017 | Xing et al. |
| 9,640,885 B2 | 5/2017 | Amini et al. |
| 9,705,273 B2 | 7/2017 | Guetig et al. |
| 9,735,495 B2 | 8/2017 | Gross |
| 9,741,465 B2 | 8/2017 | Gross et al. |
| 9,882,293 B1 | 1/2018 | Chen |
| 9,966,165 B2 | 5/2018 | Gross et al. |
| 10,103,453 B2 | 10/2018 | Pao et al. |
| 10,109,937 B2 | 10/2018 | Zerebilov et al. |
| 10,615,524 B2 | 4/2020 | Gross |
| 11,063,379 B2 | 7/2021 | Gross |
| 11,228,123 B2 | 1/2022 | Ayzenberg et al. |
| 2003/0119343 A1 | 6/2003 | Lin et al. |
| 2004/0185708 A1 | 9/2004 | Kuwahara |
| 2007/0111597 A1 | 5/2007 | Kondou et al. |
| 2009/0176400 A1 | 7/2009 | Davis et al. |
| 2013/0079609 A1 | 3/2013 | Besko |
| 2013/0130534 A1 | 5/2013 | Ohkuma |
| 2014/0191457 A1 | 7/2014 | Sharma et al. |
| 2014/0220822 A1 | 8/2014 | Keyser |
| 2018/0115093 A1 | 4/2018 | Gross |
| 2020/0373692 A1 | 11/2020 | Gross |
| 2021/0167529 A9 | 6/2021 | Ayzenberg et al. |

FOREIGN PATENT DOCUMENTS

| | | |
|---|---|---|
| DE | 3405998 A1 | 8/1985 |
| JP | 2013-247026 A | 12/2013 |
| WO | WO 2012/122974 A1 | 9/2012 |
| WO | WO 2013/006592 A2 | 1/2013 |

OTHER PUBLICATIONS

PCT/US2016/022465, Sep. 28, 2017, International Preliminary Report on Patentability.

International Search Report and Written Opinion dated Jun. 29, 2016 in connection with International Application No. PCT/US2016/022465.

International Preliminary Report on Patentability dated Sep. 28, 2017 in connection with International Application No. PCT/US2016/022465.

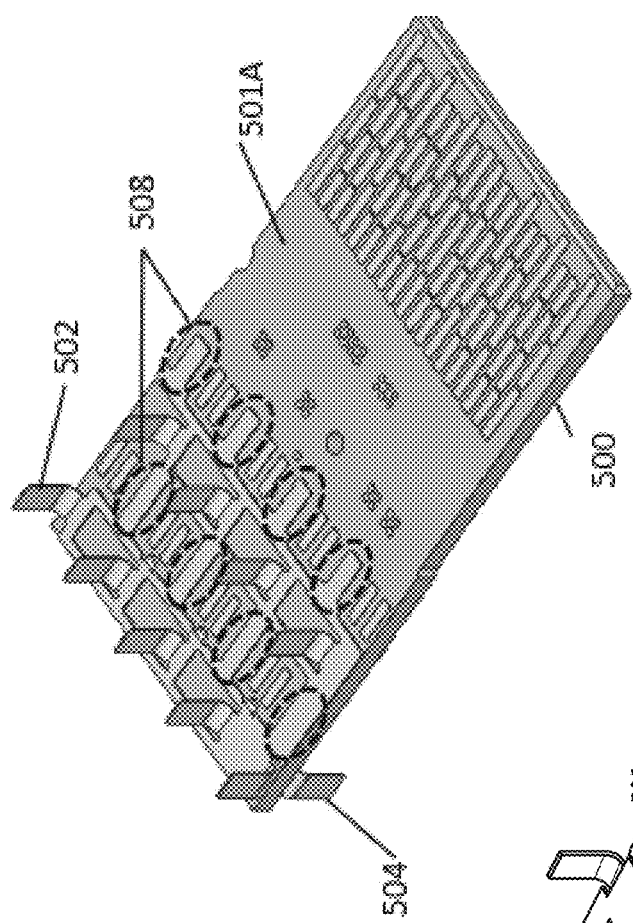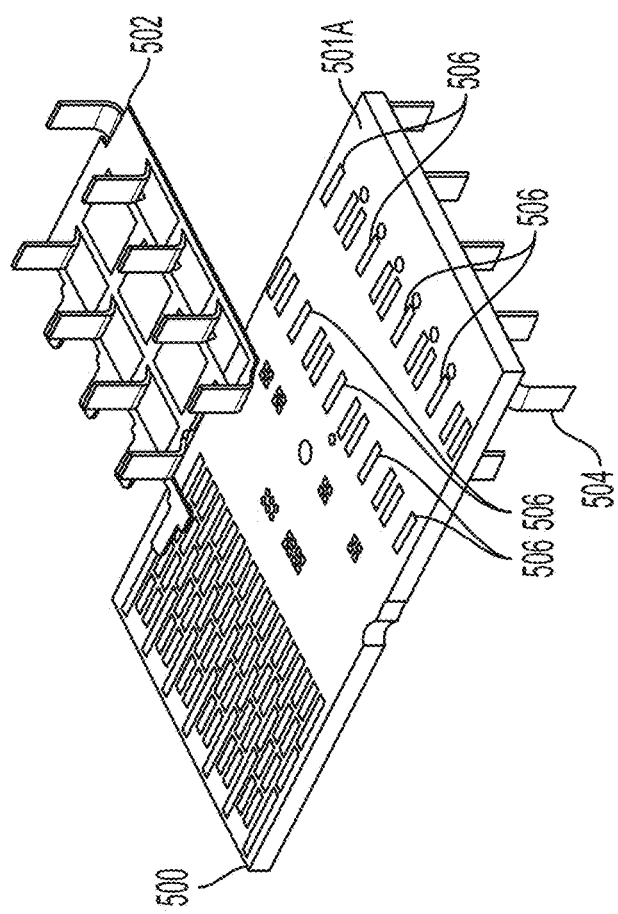
FIG. 5A
FIG. 5B

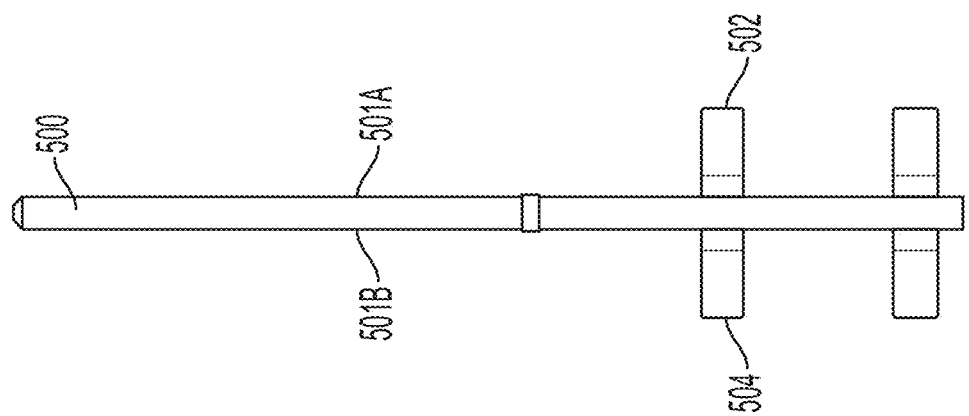
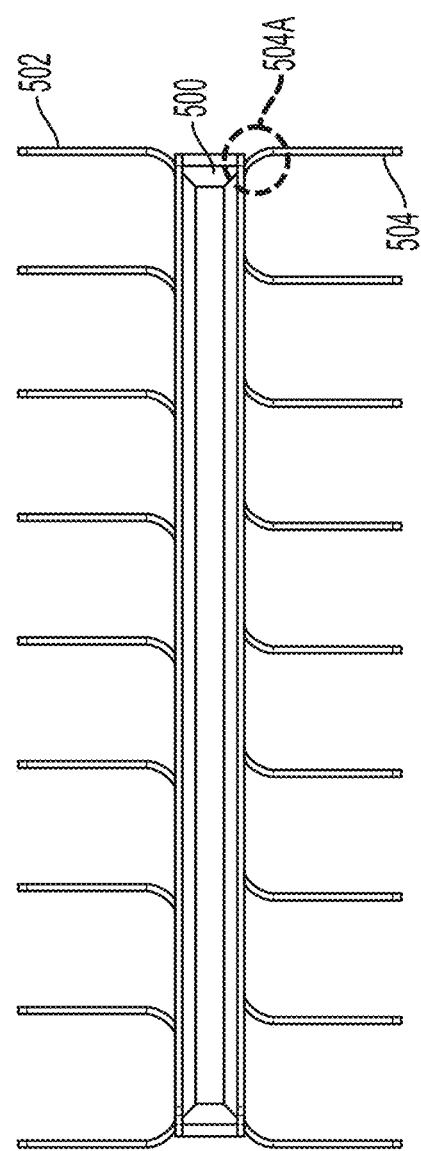

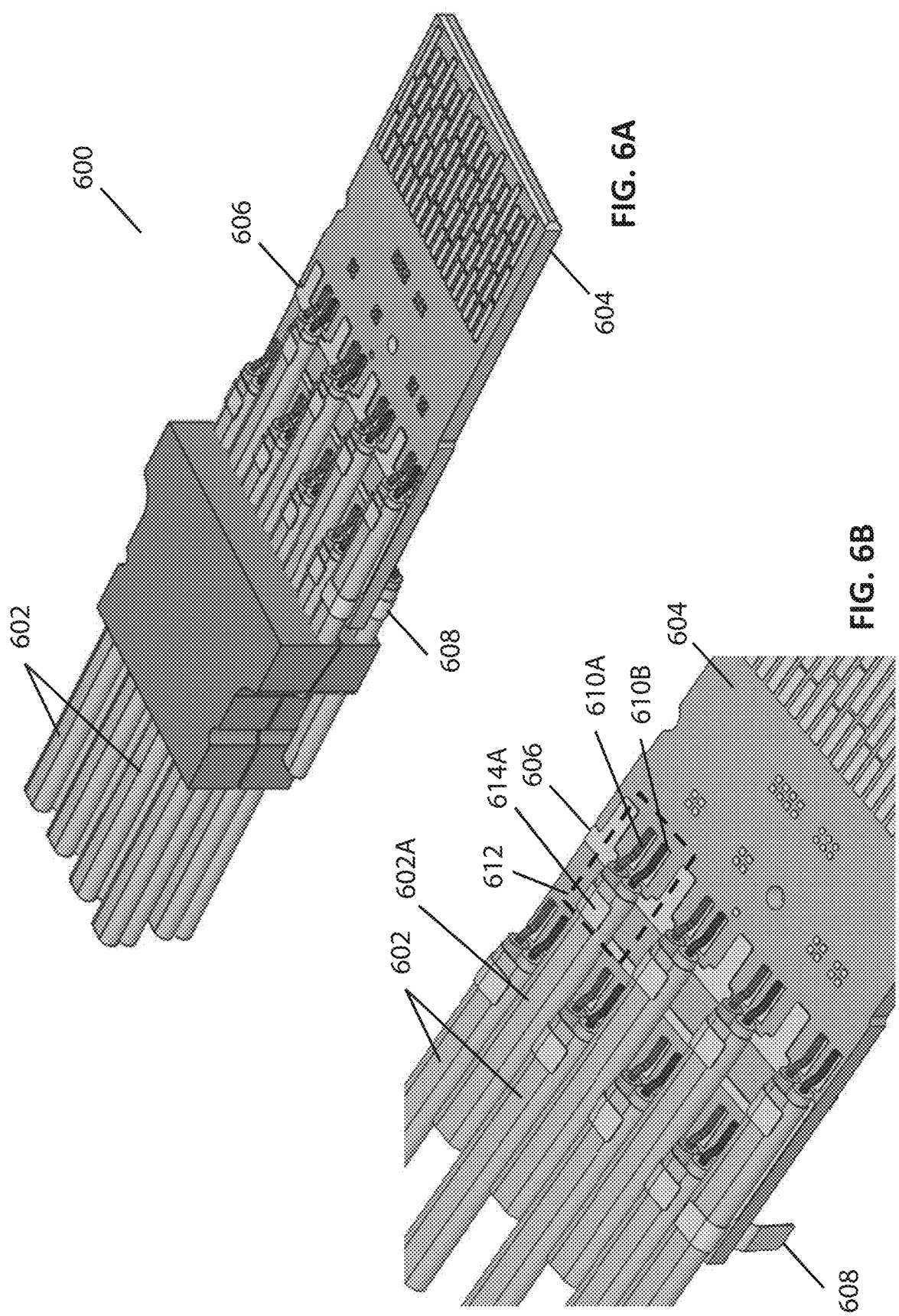

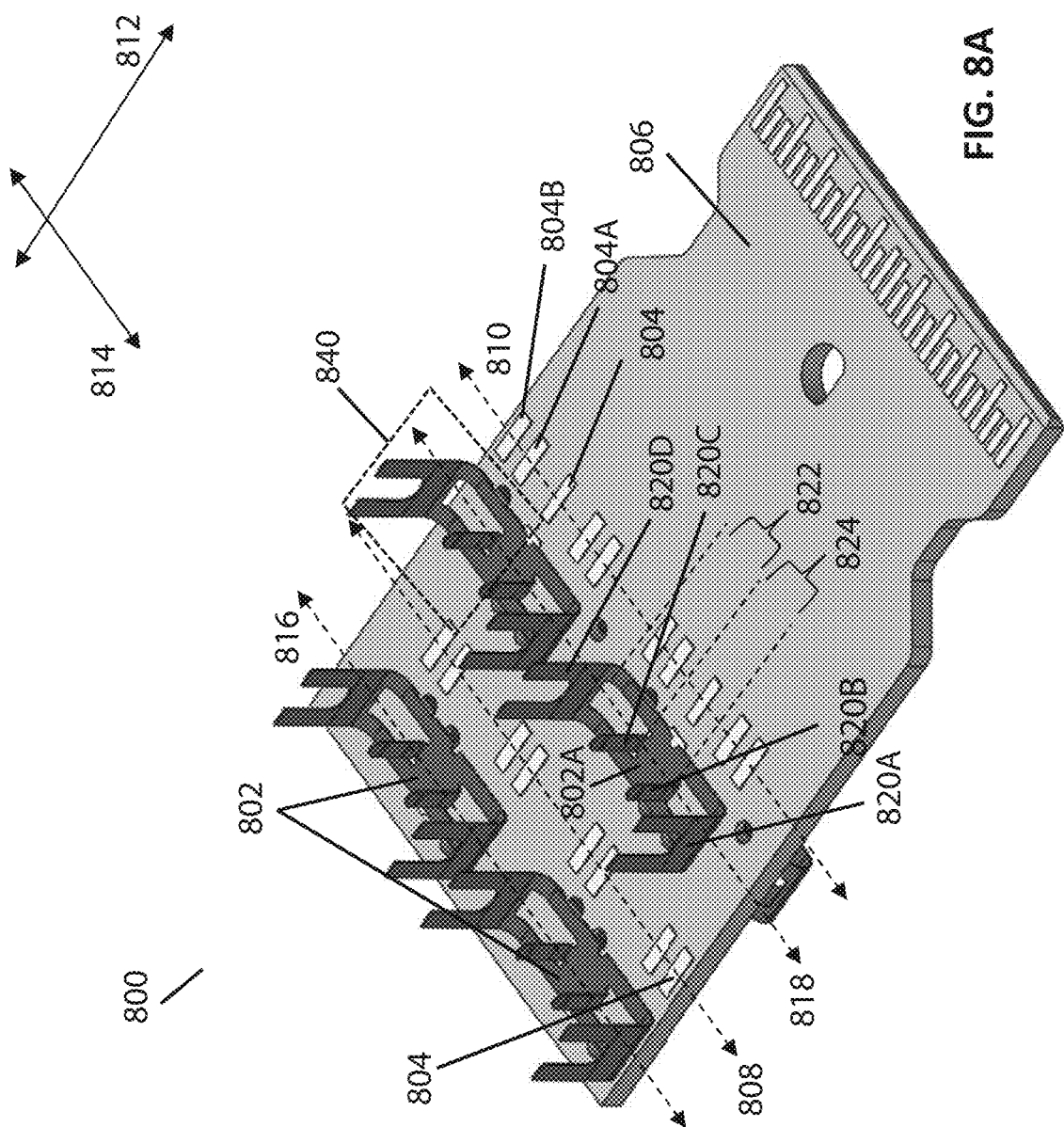

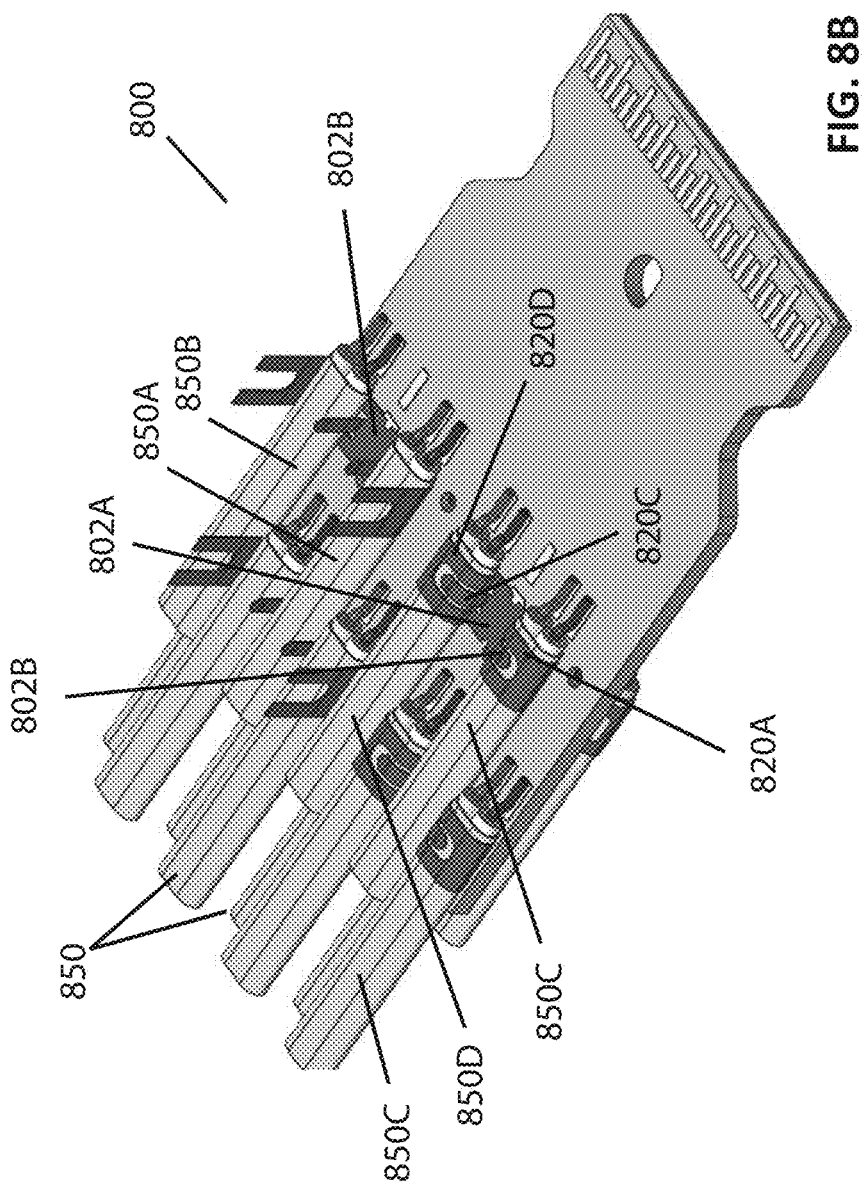

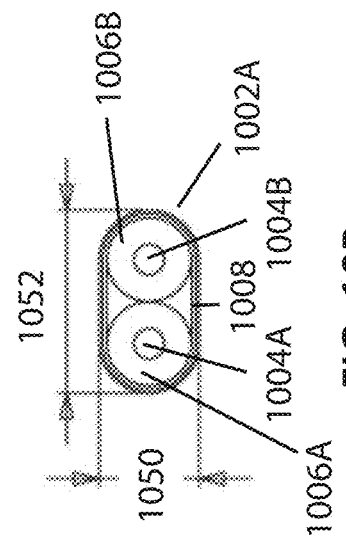
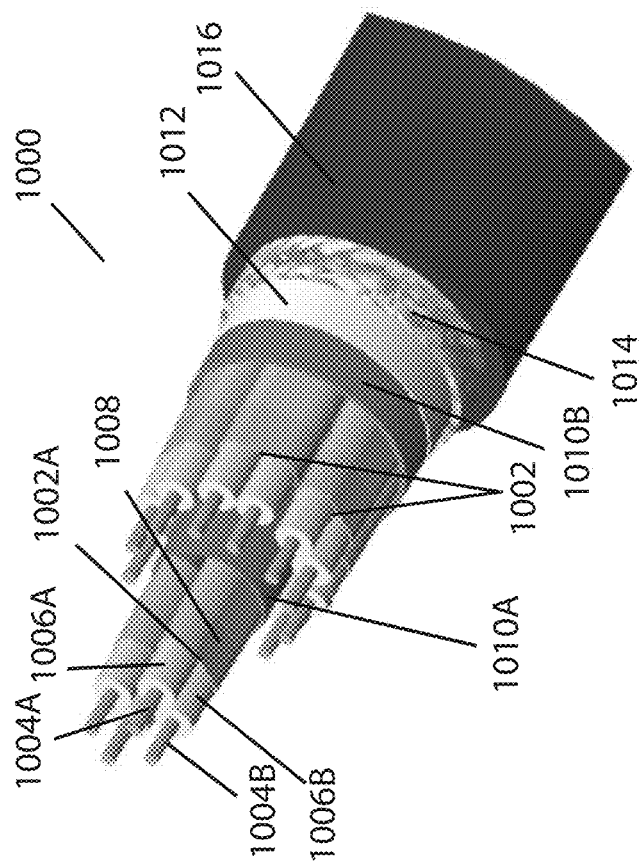
FIG. 10B
FIG. 10A

HIGH PERFORMANCE CABLE TERMINATION

CROSS-REFERENCE TO RELATED APPLICATIONS

This Application is a Continuation of U.S. application Ser. No. 16/716,176, filed Dec. 16, 2019, entitled "HIGH PERFORMANCE CABLE TERMINATION", which claims priority to and the benefit under 35 U.S.C. § 119(e) of U.S. Application Ser. No. 62/780,504, filed Dec. 17, 2018, entitled "HIGH PERFORMANCE CABLE TERMINATION". The entire contents of these applications are incorporated herein by reference in their entirety.

BACKGROUND

The techniques described herein relate generally to electrical cable assemblies used to transmit signals between electronic devices, such as servers, routers and switches.

Cables are often terminated at their ends with electrical connectors that mate with corresponding connectors on the electronic devices, enabling quick interconnection of the electronic devices.

A cable provides signal paths with high signal integrity, particularly for high frequency signals, such as those under 28 Gbps using a non-return-to-zero (NRZ) protocol, above 50 Gbps using a pulse amplitude modulation (PAM) protocol, and/or the like. Each cable has one or more signal conductors, which is surrounded by a dielectric material, which in turn is surrounded by a conductive layer. A protective jacket, often made of plastic, may surround these components. Additionally the jacket or other portions of the cable may include fibers or other structures for mechanical support.

The components of the cable that predominately impact signal propagation, i.e., the signal conductor, the dielectric and conductive layer, are generally uniform over the length of the cable. Non-uniformities on a signal path, such as might be created by changes in shape or material of the components, give rise to changes in impedance or promote mode conversion, which reduce signal integrity, as these effects are manifested as insertion loss, crosstalk or other undesirable effects.

The signal conductor, dielectric and conductive layer are flexible, giving rise to a desirable property of cables. The flexibility enables uniform cable properties to be maintained even if the cable is routed with many bends, promoting signal transmission with high integrity.

One type of cable, referred to as a "twinax cable," is constructed to support transmission of a differential signal and has a balanced pair of signal wires, embedded in dielectric material, and encircled by a conductive layer. In addition to uniform dimensions of the signal wires over the length of the cable, the spacing of the wires relative to each other and to the conductive layer is maintained over the length of the cable because those components are positioned by the dielectric. Such a cable may be formed by extruding the dielectric material around the signal wires.

The conductive layer is usually formed using foil, such as aluminized Mylar, or wire braid wrapped around the surface of the dielectric. The conductive layer influences the characteristic impedance in the cable and provides shielding that reduces crosstalk between signal conductors in twinax cables that may be routed together as a cable bundle. The conductive layer also forms the cable ground reference.

A twinax cable can also have a drain wire. Unlike a signal wire, which is generally coated with a dielectric to prevent electrical contact with other conductors in the cable, the drain wire may be uncoated so that it contacts the conductive layer at multiple points over the length of the cable. At an end of the cable, where the cable is to be terminated to a connector or other terminating structure, the protective jacket, dielectric and the foil may be removed, leaving portions of the signal wires and the drain wire exposed at the end of the cable. These wires may be attached to a terminating structure, such as a paddle card of a connector. The signal wires may be attached to conductive elements serving as mating contacts in the connector. The drain wire may be attached to a ground conductor in the terminating structure. In this way, any ground return path may be continued from the cable to the terminating structure.

SUMMARY

According to one aspect of the present application, a paddle card is provided. The paddle card may comprise a surface comprising a plurality of pads on the surface. The paddle card may comprise at least one conductive structure electrically and physically connected to pads of the plurality of pads, wherein the at least one conductive structure comprises a plurality of tabs, each tab extending upward from the surface, and each tab of the plurality of tabs is configured for electrical contact with an exposed shield of an associated cable.

According to another aspect of the present application, a cable assembly is provided. The cable assembly may comprise a paddle card comprising a surface, wherein the paddle card comprises a first plurality of pads and a second plurality of pads on the surface. The cable assembly may comprise a plurality of cables, wherein each cable of the plurality of cables comprises at least one conductor and a shield foil, wherein conductors of the at least one conductor are electrically and mechanically connected to pads of the first plurality of pads. The cable assembly may comprise at least one conductive structure electrically and physically connected to pads of the second plurality of pads, wherein the at least one conductive structure comprises a plurality of tabs, and each tab of the plurality of tabs at least partially wraps around a cable of the plurality of cables and is electrically connected to the shield foil of the cable.

The foregoing is a non-limiting summary of the invention, which is defined by the appended claims.

BRIEF DESCRIPTION OF DRAWINGS

The accompanying drawings are not intended to be drawn to scale. In the drawings, each identical or nearly identical component that is illustrated in various figures is represented by a like numeral. For purposes of clarity, not every component may be labeled in every drawing. In the drawings:

FIG. 5A is a partially exploded view of an exemplary paddle card with conductive structures, in accordance with some embodiments;

FIG. 5B is an isometric view of the exemplary paddle card with conductive structures, of FIG. 5A;

FIG. 5C is an end view of the exemplary paddle card with conductive structures of FIG. 5A FIG. 5D is a side view of the exemplary paddle card with conductive structures of FIG. 5A;

FIG. 6A is an isometric view of a portion of a cable assembly, in accordance with some embodiments;

FIG. 6B is an isometric view of the portion of the cable assembly of FIG. 6A where the cables connect to the paddle card and conductive structure, in accordance with some embodiments;

FIG. 8A is an isometric view of an exemplary paddle card with conductive structures, in accordance with some embodiments;

FIG. 8B is an isometric view of the exemplary paddle card with conductive structures of FIG. 8A, with cables;

FIG. 10A shows a second exemplary cable bundle, according to some embodiments;

FIG. 10B shows an exemplary cross-sectional view of a cable of the cable bundle of FIG. 10A, according to some embodiments;

DETAILED DESCRIPTION

Figure 1A:
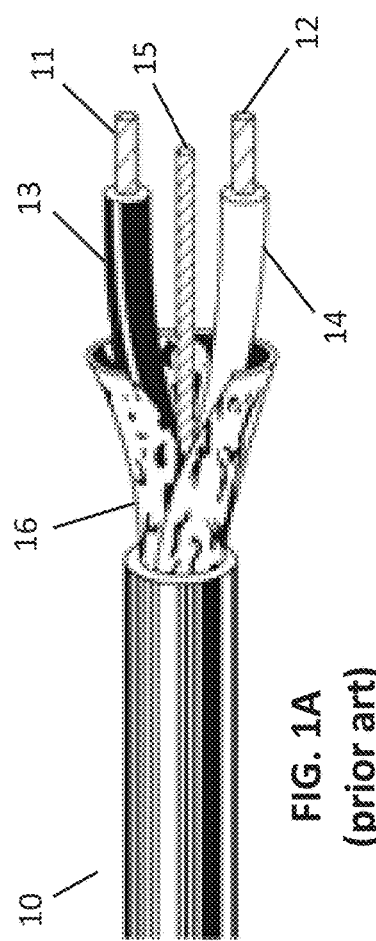
FIG. 1A is an isometric view of an electrical cable including a drain wire.

The inventors have recognized and appreciated structures for providing a high frequency, compact cable assembly. The structures may include a conductive structure, such as one or more straps, which includes a plurality of tabs that are configured for electrical contact with an exposed shield of an associated cable of the high frequency compact cable assembly. The conductive structure may be physically mounted to a surface of a printed circuit board (PCB), such that each tab extends upward from the surface of the PCB. The PCB may be a paddle card of a connector, and may include multiple pads at least partially disposed on the surface, such that at least one conductive structure is electrically and physically connected to some of the pads.

The conductive structure may be electrically connected to a ground structure within the PCB, providing conductive paths between shields of the cables and the ground structure within the PCB. In some embodiments, the conductive structure may have a plurality of portions, each portion connecting to (a) a ground pad of the ground structure that is associated with a pair of signal pads of the PCB to which a pair of signal conductors are connected, and (b) to the shield of the cable terminated to that pair of signal pads. The portions may be configured such that crosstalk is low where the cables are terminated to the PCB, leading to low crosstalk in the cable assembly. The portion may be integrally formed from the same conductive material and may have, for each high speed cable, an attachment to a ground structure of the printed circuit board. The ground structure of the PCB may include a pad on the surface of the PCB near or adjacent the signal pads to which the cable is terminated. Each portion may provide a return path for common mode signals in a cable. The conductive structure may have openings, exposing the signal pads on the PCB, and facilitating close proximity between the signal conducts and an associated return path.

In some embodiments, the tabs of the conductive structure may include a first set of tabs and a second set of tabs. The first set of tabs may be in a first row, and the second set of tabs may be in a second row parallel to the first row. In some embodiments, the cable assembly may include a plurality of conductive structures. Each conductive structure may be electrically and physically connected to ground pads of a subset of the pads. The plurality of conductive structures may include one or more U-shaped tabs, one or more single finger tabs at an interior portion of the conductive structure, or both.

The paddle card of the cable assembly may include signal pads and ground pads on the surface of the PCB. The cable assembly may include a plurality of cables that each includes at least one signal conductor and a shield foil surrounding the signal conductors. The signal conductors may be electrically and mechanically connected to signal pads. The conductive structures may be electrically and mechanically connected to the ground pads, and each tab may at least partially wrap around a cable to electrically connect to the shield foil of the cable.

The end of the cable may include an exposed portion of the shield foil, which surrounds, at least in part, the at least one conductor. In some embodiments, each cable may include at least two conductors and the shield foil, such as a twinax cable. The cable may have no drain wire. The cables may be electrically and physically mounted to the PCB in different rows along the PCB, so that connections for neighboring cables are staggered along the width of the PCB. One row may include cables used for transmitting signals, and one row may include cables for receiving signals. Cables with a plurality of conductors may be physically and electrically mounted to the PCB, with the conductors for a particular cable mounted side-by-side on the PCB.

A termination structure as described herein may provide low crosstalk between signal paths, including low crosstalk between adjacent cable terminations of rows of cable terminations on the paddle card. Such a termination structure may alternatively or additionally provide low crosstalk between transmit and receive signal paths, which may be terminated in different rows on the paddle card. In some embodiments, the far end crosstalk may be less than 35 dB over a frequency range of 1 to 20 GHz. In some embodiments, the far end crosstalk may be less than 40 dB over substantially all of the frequency range, such as more than 90% of that frequency range. Such crosstalk may be achieved even for compact cable assemblies, such as those sufficiently compact to include a paddle card having a width and/or other aspects/dimensions as defined in the OSFP or QSFP-DD standards.

Alternatively or additionally, cable terminations as described herein may enable low loss cable assemblies. For example, a cable assembly may have cables with a length ranging from 2.5 meters to 3.5 meters, and a signal loss ranging from 15 dB to 20 dB at Nyquist frequency. As a specific example, a cable assembly may exhibit end to end attenuation of less than 17 dB at 13.28 GHz with a cable length of 2.5 meters or in some embodiments 3 meters. Such low insertion loss may be achieved with a drainless cable. One or more conductors of each cable can have a gauge ranging between 34 American Wire Gauge (AWG) to 24 AWG, nonetheless, as a result of the cable termination techniques described herein, these terminations may be sufficiently compact to fit within a paddle card having a width as defined in the OSFP or QSFP-DD standards. Those techniques enable closely spaced terminations and use of drainless cables. As a specific example, an OSFP cable assembly supporting signaling up to 56 Gbps may have cables with 25 AWG signal conductors, a length of, and a nominal impedance of 100 ohms, with 17 dB or less of insertion loss at a 3 meter cable length. As another specific example, a QSFP-DD cable assembly supporting signaling up to 56 Gbps per lane may have cables with 27 AWG signal conductors, and a nominal impedance of 100 ohms, with 17 dB or less of insertion loss at a 3 meter cable length.

Cable assemblies as described herein may be configured to support signals having any suitable electric bandwidth, such as more than 20 GHz, more than 30 GHz or more than 40 GHz. For an illustrative example, PAM4 signaling for Ethernet can achieve 53.12 Gbps. The baud-rate (signaling rate) is 26.56 GBaud. The communicating devices can be intentionally cut-off at 75% of the 26.56 GBaud signaling rate with low-pass filters (e.g., to ensure a sufficient signal-to-noise ratio). As a result, the effective achievable bandwidth in GHz is 0.75*26.56 Gbaud=19.92 GHz. Cable assemblies as described herein may support that signaling rate in each of multiple channels.

FIG. 1A illustrates a conventional electrical cable. Electrical cable 10, also referred to as "twinax cable", comprises signal wires 11 and 12, which are covered by dielectric coating 13 and 14 respectively. The signal wires 11 and 12 may be configured to carry a differential signal, in some embodiments. The cable further comprises a third, uncovered wire 15, referred to as "drain wire". Signal wires 11 and 12 and drain wire 15 are surrounded by conductive layer 16, which is configured to serve as an electric shield. The drain wire 15 electrically contacts the conductive layer 16 at multiple locations along the cable (not shown), thus maintaining a ground reference with the conductive layer. As illustrated in FIG. 1A, the enclosing jacket and the conductive layer have been removed from the end of the cable to permit termination.

Figure 1B:
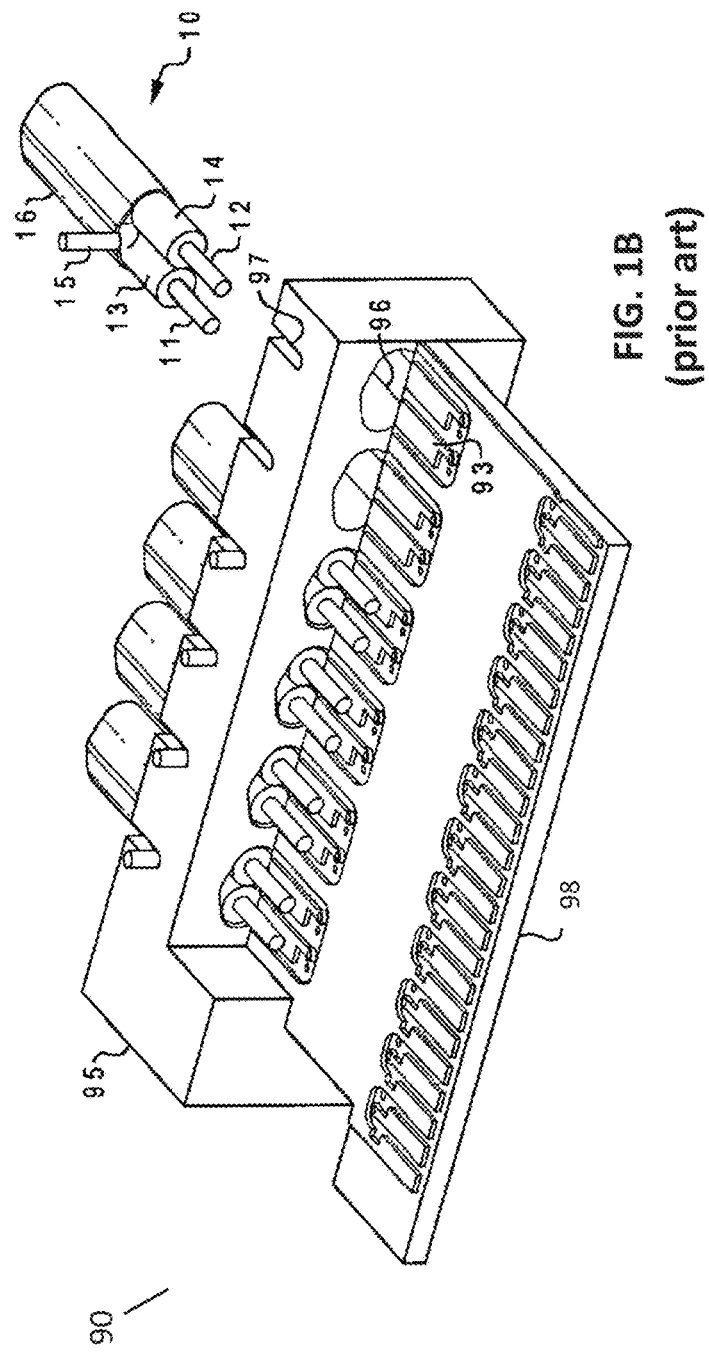
FIG. 1B is an isometric view of a connector configured to operate in connection with the electrical cable of FIG. 1A.

FIG. 1B illustrates a connector 90 configured to terminate one or more cables 10. Connector 90 comprises a circuit board 98 and grounding portion 95. Grounding portion 95 includes a plurality of openings 96, each configured to receive a cable 10. When a cable 10 is inserted into an opening 96, signal wires 11 and 12 form electrical contacts with contact portions 93. Furthermore, grounding portion 95 includes a plurality of slots 97, each slot being configured to receive therein the drain wire of the corresponding cable 10. The grounding portion may contact the various drain wires, thus keeping the cables grounded and providing a return path from the paddle card to the wire. While the use of drain wires ensures signal integrity throughout the length of the cable, having to include an additional wire may add weight, may reduce the flexibility of the cable, may take up additional space, and/or the like.

Figure 2B:
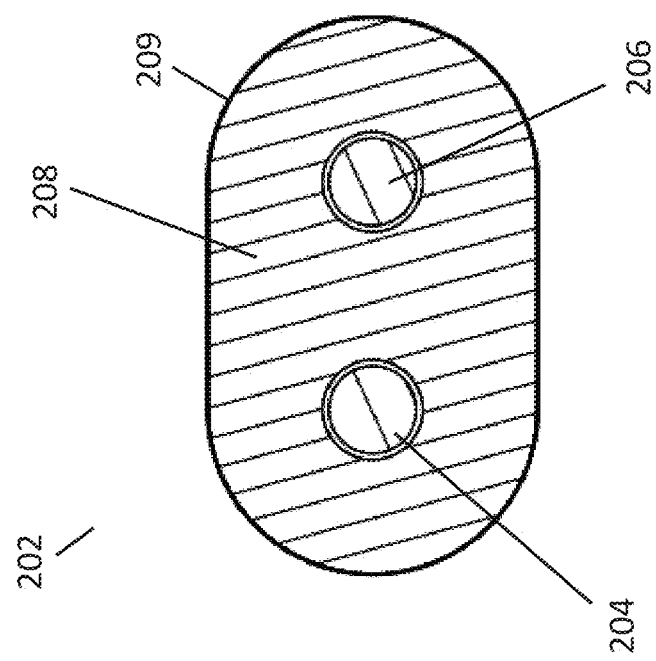
FIG. 2B is a cross sectional view of an exemplary drainless electrical cable.
Figure 2A:
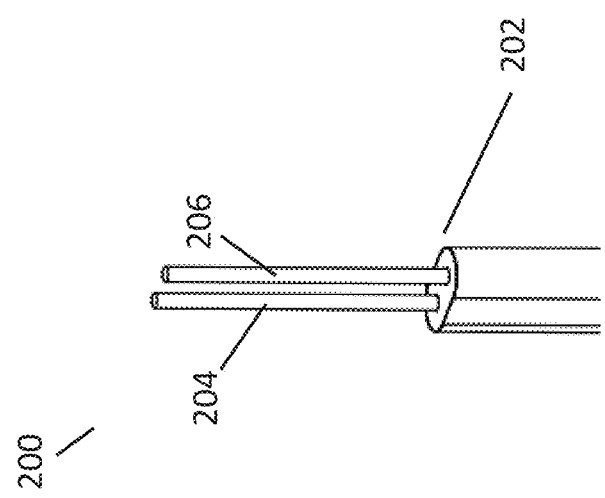
FIG. 2A is a view of an end of an exemplary drainless electrical cable.

FIG. 2A is a view of an exemplary cable end 202 of cable 200. The cable 200 may comprise a pair of signal conductors 204 and 206. As shown, the signal conductors 204 and 206 may extend outward at the cable end 202. Any suitable approach may be used to configure the end 202 of the cable 200 in this way. A known technique for terminating a cable is to strip away, at the end of the cable, components of the cable to expose the signal conductors. In accordance with some embodiments, different components may be stripped away to expose different components of the cable. For example, the jacket, a conductive layer and dielectric may be stripped away at the distal end of the cable to expose signal conductors at the distal end of the cable. In other regions, only the jacket may be removed, exposing the conductive layer.

FIG. 2B is a cross sectional view of the cable 200 at the end 202. As illustrated, signal conductors 204 and 206 may be surrounded by a dielectric material 208, which may be configured to prevent the signal conductors from contacting one another. Alternatively, or additionally, the signal conductors may be coated with a dielectric material. Signal conductors 204 and 206 may be formed from copper or from a copper alloy, such as copper-zinc, copper-nickel, copper-magnesium, copper-iron, etc. Dielectric material 208 may be enclosed within a conductive layer 209, which may comprise a foil, such as aluminized Mylar foil, or wire braid wrapped around the surface of the dielectric material. Conductive layer 209 may be configured to provide shielding so as to reduce crosstalk between adjacent signal conductor pairs. As illustrated, cable 200 may be drainless as it does not include drain wires in the illustrated embodiment.

Figure 3A:
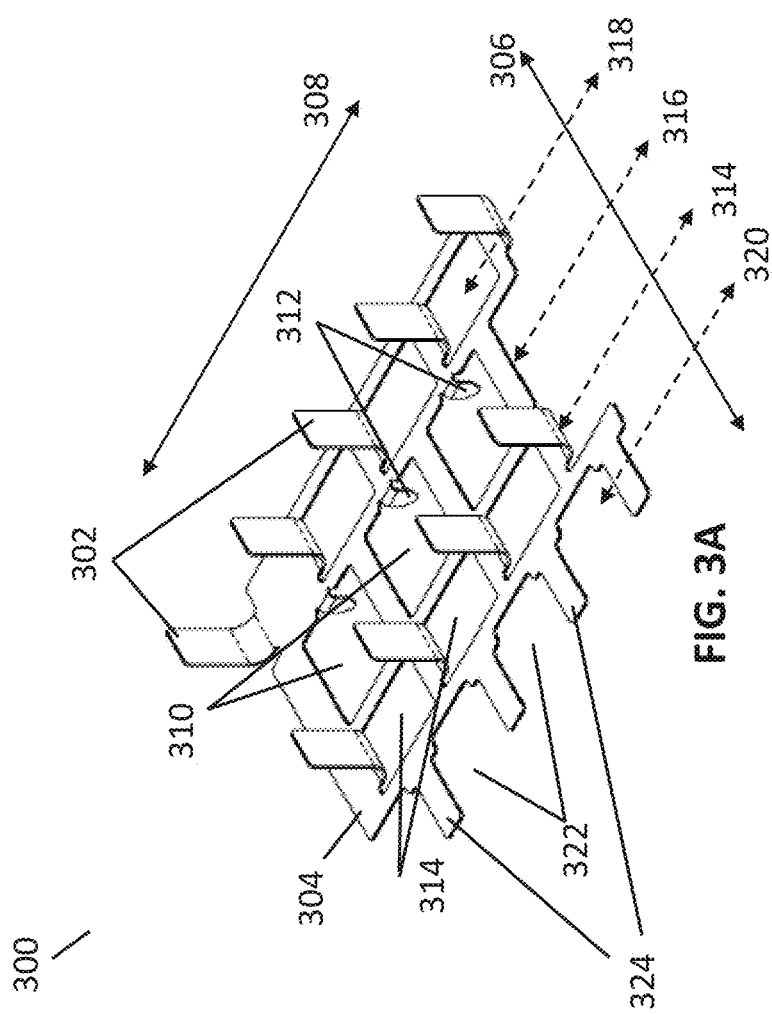
FIG. 3A is an isometric view of an exemplary conductive structure, in accordance with some embodiments.
Figure 3B:
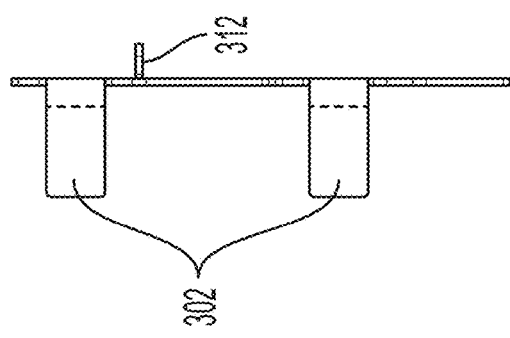
FIG. 3B is a first side view of the exemplary conductive structure of FIG. 3A.
Figure 3C:
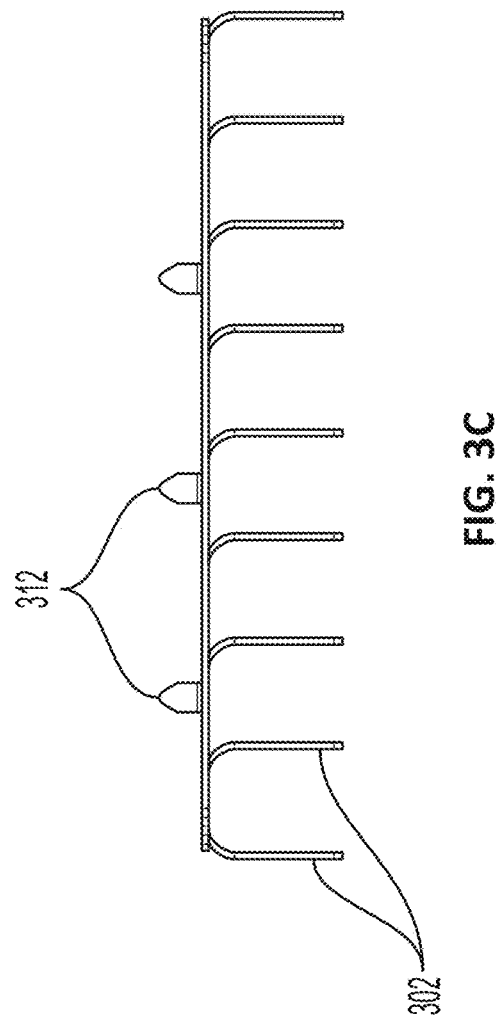
FIG. 3C is a second side view of the exemplary conductive structure of FIG. 3A.

According to one aspect of the present application, the electrical properties at the termination of the cables (e.g., crosstalk) can be improved using a conductive member providing ground connections between cables and a PCB to which those cables are terminated. As discussed further herein, the conductive member can provide individual ground paths for each cable, which can result in improved electrical properties at the termination (e.g., compared to connectors without conductive members). FIG. 3A is an isometric view of an exemplary conductive structure 300, in accordance with some embodiments. FIGS. 3B and 3C show a side view and an end view of the exemplary conductive structure 300, in accordance with some embodiments. The conductive structure 300 includes a surface 304 that extends along a first direction 306 and a second direction 308. FIG. 3B shows the side of the conductive structure 300 when viewing the conductive structure 300 in the second direction 308. FIG. 3C shows an end of the conductive structure 300 when viewing the conductive structure 300 in the first direction 306.

The conductive structure 300 includes a plurality of tabs 302, each of which extends upwards from the surface 304 of the conductive structure 300. In this exemplary embodiment, the tabs 302 extend orthogonal to the surface 304 and include a bent portion where the tab meets the surface 304 of the conductive structure 300.

As discussed in conjunction with FIGS. 5A-5B, the conductive structure can be designed so that when the conductive structure is mounted to a PCB, the conductive structure is electrically and physically connected to certain portions of the PCB (e.g., ground pads), while not being in electrical and/or physical connection with other portions of the PCB (e.g., signal pads). To avoid physical contact with such portions, the conductive structure can include openings that extend in directions 306 and 308. In the example shown in FIG. 3A, the conductive structure 300 includes a plurality of openings 310 in the surface 304, which are defined on all sides by the conductive structure 300 such that the conductive structure 300 entirely surrounds the openings 310. However, it is not a requirement that the openings be completely surrounded. The conductive structure 300 includes a plurality of openings 322 in the surface 304, which are defined on three sides by the conductive structure 300, such that the conductive structure 300 partially surrounds each of the openings 322, including by projections 324 of the conductive structure 300. While not shown in FIG. 3A, in some embodiments the conductive structure can entirely surround the openings 322 (e.g., similar to openings 310).

As shown in this example, one or more of the openings 310 can include a protrusion 312 that extends downward into a corresponding opening 310. In some embodiments, the protrusions 312 are used to align the conductive structure 300 onto a PCB, such as by fitting into holes in the PCB. In some embodiments, the protrusions 312 may be soldered to the ground structure of the PCB.

In some embodiments, the tabs and openings can be formed and/or disposed in rows of the conductive structure 300. As shown in the exemplary conductive structure 300, a first set of tabs 302 are in the row indicated by arrow 314, and second set of tabs 302 are in the row indicated by arrow 318, with both rows extending along direction 308. The openings 310 are in the row indicated by arrow 316, and the openings 322 are in the row indicated by arrow 320, with both rows also extending along direction 308. As shown by the arrows 314, 316, 318 and 320, the rows are orthogonal to the direction 306. As also shown by the arrows 314, 316, 318 and 320, the rows are spaced from each other along the direction 306.

The conductive structure can be formed from a sheet of metal. For example, the conductive structure can be stamped from a sheet and then portions into the shape shown in FIGS. 3A-3C from a sheet of metal. The conductive structure 300 includes, for example, a plurality of voids 314 from which a subset of the tabs 302 are stamped. The conductive structure can be made of any type of conductive material, such as stainless steel or other metal.

As discussed herein, the conductive structure can be used in various applications, such as for standard-based connectors (e.g., for OSFP, QSFP-DD, etc.). The conductive structure can be mounted (e.g., soldered) to a PCB serving as a paddle card in a plug connector prior to connection of the cables, so that the conductive structure sits between the cables and the PCB. The conductive structure can be used to provide individual ground paths to cables, such as cables without drain pads. Some standards specify dimensions of various aspects of the connectors, such as the dimensions of a paddle card, the number, size and location of solder pads, etc. The conductive structures discussed herein can be used to provide individual ground paths to cables that do not have drain wires, which can reduce crosstalk across cables of the connector. Being able to omit drain wires from the cables while still providing sufficient electrical characteristics at the terminations can allow the cables to be thinner, to use a thicker (e.g., lower gauge) wire (e.g., for less loss than thinner wire), and/or both.

Figure 4A:
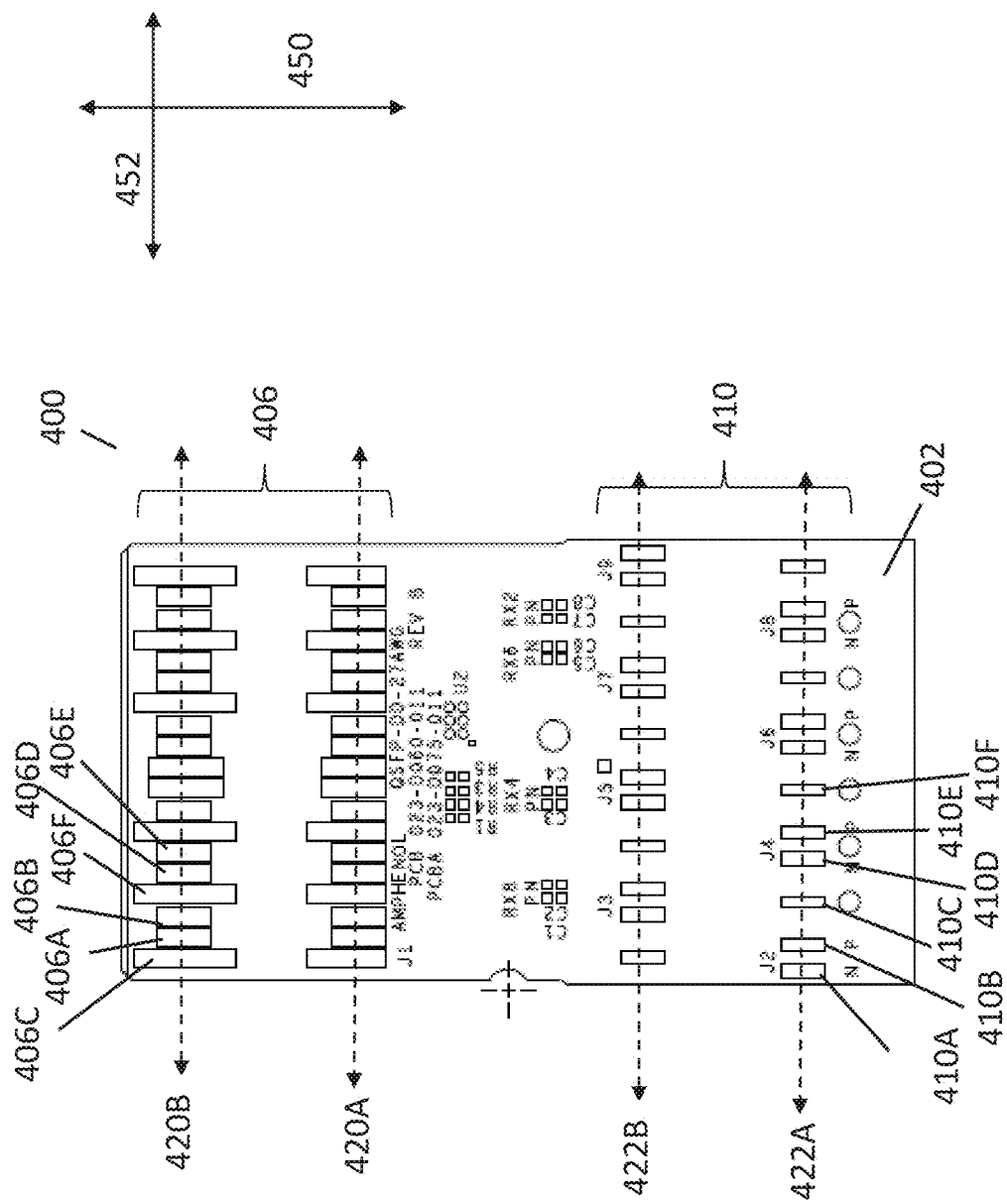
FIG. 4A is a plan view of a surface of an exemplary paddle card.
Figure 4B:
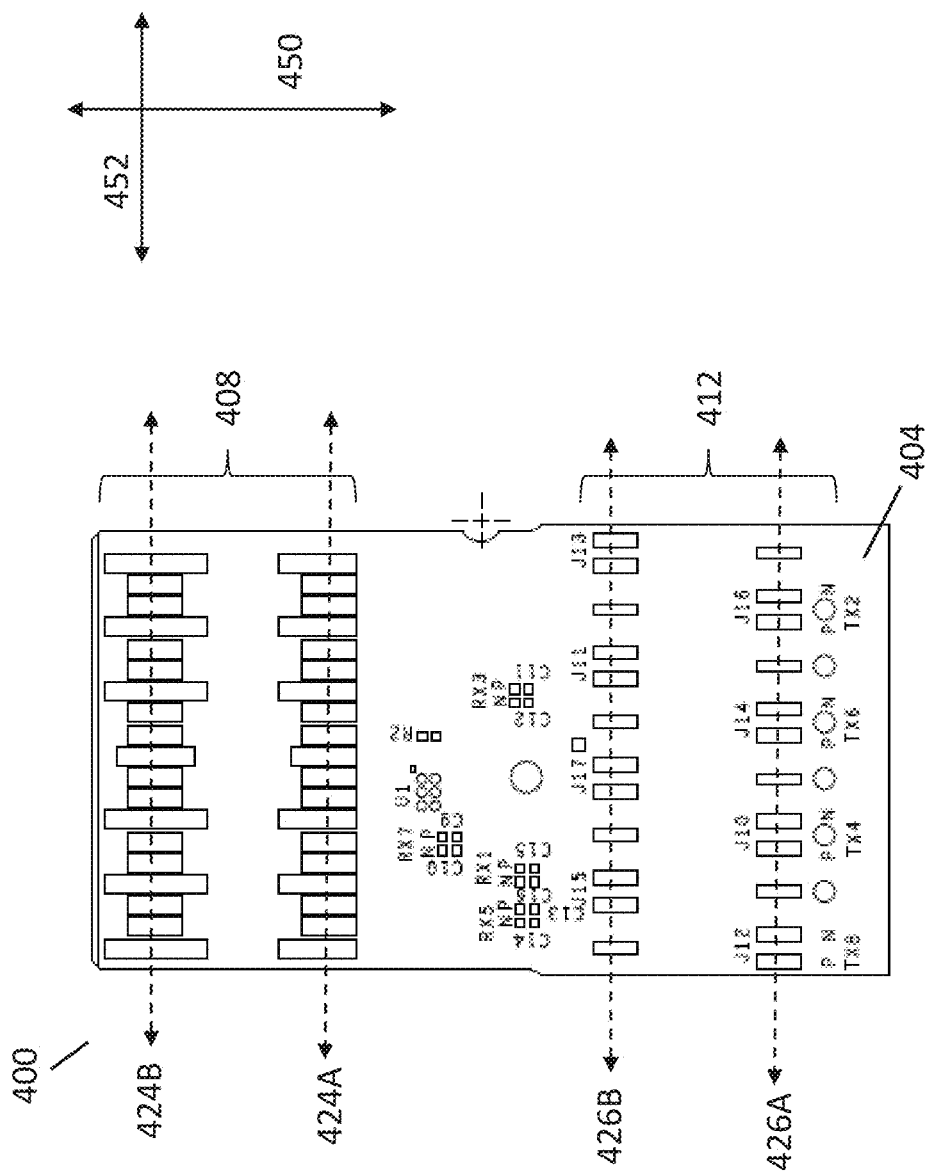
FIG. 4B is a plan view of the opposite side of the exemplary paddle card of FIG. 4A.

FIG. 4A is a plan view of a first side 402 of an exemplary paddle card 400, and FIG. 4B is a plan view of the opposite side 404 of the exemplary paddle card 400. The paddle card extends along a first direction 450 and a second direction 452. The width of the paddle card 4A (here shown as being in the second direction 452) may be specified by the associated standard, at least at the mating interface where contact pads 406 are located. For example, in some embodiments, the width may range between 13.25 and 19.75 millimeters, between 19.5 and 29 millimeters, and/or the like. In many commercial implications, the paddle card will have the same width over its entire length.

Each side 402 and 404 has contact pads 406 and 408 shown in FIGS. 4A-4B. Each side 402 and 404 also has solder pads 410 and 412. The pads can be implemented in various ways, such as by a layer of metal disposed on the surface of the paddle card 400 over or otherwise connected to a via within the paddle card 400 or as the top of a via within the paddle card 400.

The solder pads 410 are arranged along two rows shown by dotted arrows 422A and 422B, and the solder pads 412 are similarly arranged along two rows shown by dotted arrows 426A and 426B. Like the contact pads 406 and 408 as discussed below, the solder pads 410 and 412 include sets of solder pads. There may be a set of solder pads per cable. FIG. 4A shows a first set of solder pads J2, which includes signal solder pads 410A and 410B and ground solder pad 410C disposed to the right of the signal solder pads 410A and 410B. In this exemplary embodiment, the solder pads 410A, 410B and 410C are used to electrically and physically connect to the pair of signal wires (denoted "n" and "p" in the figure) and the ground of an associated transmit cable (e.g., the first transmit cable), respectively. FIG. 4A also shows a second set of solder pads J4, which includes signal solder pads 410D and 410E and ground solder pad 410F disposed to the right of the signal solder pads 410A and 410B. In this exemplary embodiment, the solder pads 410D, 410E and 410F are used to electrically and physically connect to the n and p signal wires and the ground of an associated transmit cable (e.g., the third transmit cable), respectively. The ground solder pads and pairs of signal solder pads in each row may alternate. For example, the pair of signal solder pads 410D and 410E are disposed between ground solder pads 410C and 410F, and ground solder pad 410C is disposed between signal solder pad pairs 410A/410B and 410D/410E.

In some embodiments, paddle card 400 may be constructed such that at least one of the ground solder pads adjacent a pair of signal pads is attached to a portion of the ground structure within the paddle card to which the traces attached to the pair of signal pads are referenced. If there is a common mode signal on the pair of traces, for example, there will be a corresponding return current flow through the ground structure to which those traces are referenced. In a paddle card, for example, ground planes may be interleaved between layers carrying signal traces such that the traces are referenced to an adjacent ground plane, which may be the closest ground plane to the traces.

The contact pads 406 and 408 are in electrical communication with the solder pads 410 and 412, respectively, through the interior of the paddle card. For example, a trace within the paddle card connects solder pad 410A with contact pad 406A; a second trace within the paddle card connects solder pad 410B with contact pad 406B; and a ground plane within the paddle card may connect solder pad 410C with the solder pad 410C. As another example, a third trace may connect solder pad 410D with contact pad 406D; a fourth trace may connect solder pad 410E with the contact pad 406E. The same, or a different ground plane, may connect solder pad 410F with solder pad 410F. Thus, like the contact pads 410 and 412, the contact pads 406 and 408 can be logically grouped into sets of contact pads associated with the cables terminated to the paddle card.

For example, each set of contact pads in the contact pads 406 may include a pair of signal pads and a ground pad, which facilitate connection of the signals from the associated cable to corresponding contacts of a mating connector. For example, FIG. 4A shows a first set of contact pads, which includes signal contact pads 406A and 406B and ground contact pad 406C. In the illustrated embodiment, the ground contact pads, such as 406C, are longer than the signal contact pads, such as contact pads 406A and 406B. FIG. 4A also shows a second set of contact pads, which includes signal contact pads 406D and 406E and ground contact pad 406F. FIGS. 4A and 4B show other contact pads that are not numbered for simplicity. The contact pads 406 are arranged along two rows shown by dotted arrows 420A and 420B, and the contact pads 408 are similarly arranged along two rows shown by dotted arrows 424A and 424B. Each row includes a plurality of sets of contact pads.

The ground contact pads and pairs of signal contact pads in each row may alternate. For example, the pair of signal contact pads 406A and 406B are disposed between ground contact pads 406C and 406F, and ground contact pad 406F is disposed between signal pairs 406A/406B and 406D/406E. As shown, there is a space between the contact pads 406 and 408 (e.g., the space between rows 420A and 420B in FIG. 4A). In some configurations, pre-wipe pads may be disposed between the rows of contact pads 406 and 408 or may be disposed between some or all of the contact pads in a row proximate an edge of the paddle card and that edge (e.g., as shown in FIGS. 5A-5B).

While not shown in FIGS. 4A-4B, active components can be attached to the paddle card 400. For example, the paddle card 400 can be sized sufficiently such that active components can be attached to the paddle card 400 in the space between the row 420A of contact pads and the row 422B of contact pads shown in FIG. 4A. For example, filters, amplifiers, transceivers, and/or the like are examples of active components that can be attached to the paddle card 400. For example, in some applications it can be desirable to convert from the communication protocol being used on the cable to a different communication protocol (e.g., to convert between different communication standards). Active components can be included on the paddle card 400 to perform the conversion on the paddle card 400, such that a different protocol is provided to a mating connector.

In some embodiments, the conductive structures may be electrically and physically mounted to the solder pads of either or both sides of the paddle card. In particular, as discussed further herein, the conductive structures may be sized for electrical and physical connection (e.g., via soldering) to the ground solder pads of the paddle card. FIG. 5A is a partially exploded view of an exemplary paddle card 500 with conductive structures 502 and 504, in accordance with some embodiments. Paddle card 500 may be constructed like paddle card 400, except with a different configuration of contact pads.

As shown in this example, the conductive structure 504 is mounted on the bottom side of the paddle card 500. The conductive structure 502 is electrically and physically connected to the ground solder pads 506 of the top side of the paddle card 500. FIG. 5B is an isometric view of the exemplary paddle card 500, showing the conductive structure 502 electrically and physically connected to the paddle card 500. Since the conductive structure 502 is connected to the paddle card 500, the ground solder pads 506 in FIG. 5A are not visible in FIG. 5B. FIG. 5B highlights where the conductive structure 502 is electrically and physically connected to the ground solder pads 506 using dotted areas 508.

FIG. 5C is a first side view of the paddle card, in accordance with some embodiments. FIG. 5C is a view of the end of the paddle card 500, when viewing the side of the paddle card 500 in the first direction 450 that is opposite the side at which the conductive structures 502 and 504 are connected to the paddle card 500. FIG. 5D is a side view of the paddle card 500, in accordance with some embodiments. FIG. 5D is a view along the second direction 452 of the left side of the paddle card. As shown, the tabs 504 extend orthogonal to the surface of the conductive structure, and include a bent portion 504A where the tab 504 meets the surface of the conductive structure. As shown in FIGS. 5C and 5D, the conductive structures 502 and 504 are mounted at locations opposite each other on the respective sides 501A and 501B of the paddle card 500.

In some circumstances, it may be desirable to control the electrical properties if a cable assembly such as far-end crosstalk. Crosstalk, and other undesirable electrical properties may arise as a result of the manner in which the cables of the assembly are terminated to the paddle card. A mechanical discontinuity necessarily occurs where the cables, including the signal wires and drain wire (or shield) are connected to the paddle card. For example, as discussed in conjunction with FIG. 2A, in order to connect cables to the paddle card (e.g., at the solder pads), the layers of the cable (e.g., the conductive layer and the dielectric coatings on the signal wires) are removed so that the signal wire terminations can be connected (e.g., soldered) to the paddle card. Such a discontinuity can give rise to one or more effects that impact the integrity with which a signal passes through the cable assembly. For example, the propagating mode of some of the signal energy carried by a cable may change such that not all of the energy in the signal cable will transition to the paddle card (or vice versa). Some of the energy that does not transition into the paddle card may be radiated, giving rise to crosstalk. Additionally, the mechanical discontinuity can create the potential for reflections of the signal, which can cause further attenuation because the signal energy travels backwards through the signal wires instead of into the paddle card.

The conductive structure may be configured to provide a cable termination that has a small impact on signal integrity. The conductive structure may include portions that create separate ground paths for each cable (e.g., for each pair of signal wires). The conductive structure may be shaped and positioned to act as the closest ground conductor to a signal conductor in the cable or connector terminating the cable. The conductive structure may be shaped to provide a ground path for each cable or each signal pair. The conductive structure connects to the ground portion of the cable (e.g., the shield of a cable). Moreover, the conductive structure may be shaped and positioned to provide a spacing between signal conductors and the nearest ground in the cable termination that smooths any impedance transition between the signal conductors in the cable and the traces in the paddle card to which those signal conductors are connected. The conductive structure may be shaped and positioned to provide an impedance in the signal path at the termination that approximates the impedance within the signal conductors or within the traces or that transitions between the impedance in the cable and in the paddle card. Alternatively or additionally, the conductive structure may be shaped and positioned relative to the signal path to approximate the spacing between the signal conductors and the nearest ground in the cable.

Alternatively or additionally, the conductive structures may be shaped and positioned to provide separate ground paths for each signal conductor or pair of signal conductors that approximates the separate ground paths for the signal conductors as exists within a cable. For example, for a twinax cable with no drain wire, the tabs of the conductive structure mechanically and electrically connect to the exposed shields of the cables of the assembly to complete the conducting path from the cable shields to the ground structure of the paddle card. That connection may be made to the portion of the ground structure to which the traces in the paddle card coupled to the signal conductors of the same cable are referenced. The separate ground paths may reduce crosstalk because there is less coupling of ground return paths of the cables that are terminated to the paddle card.

Figure 5E:
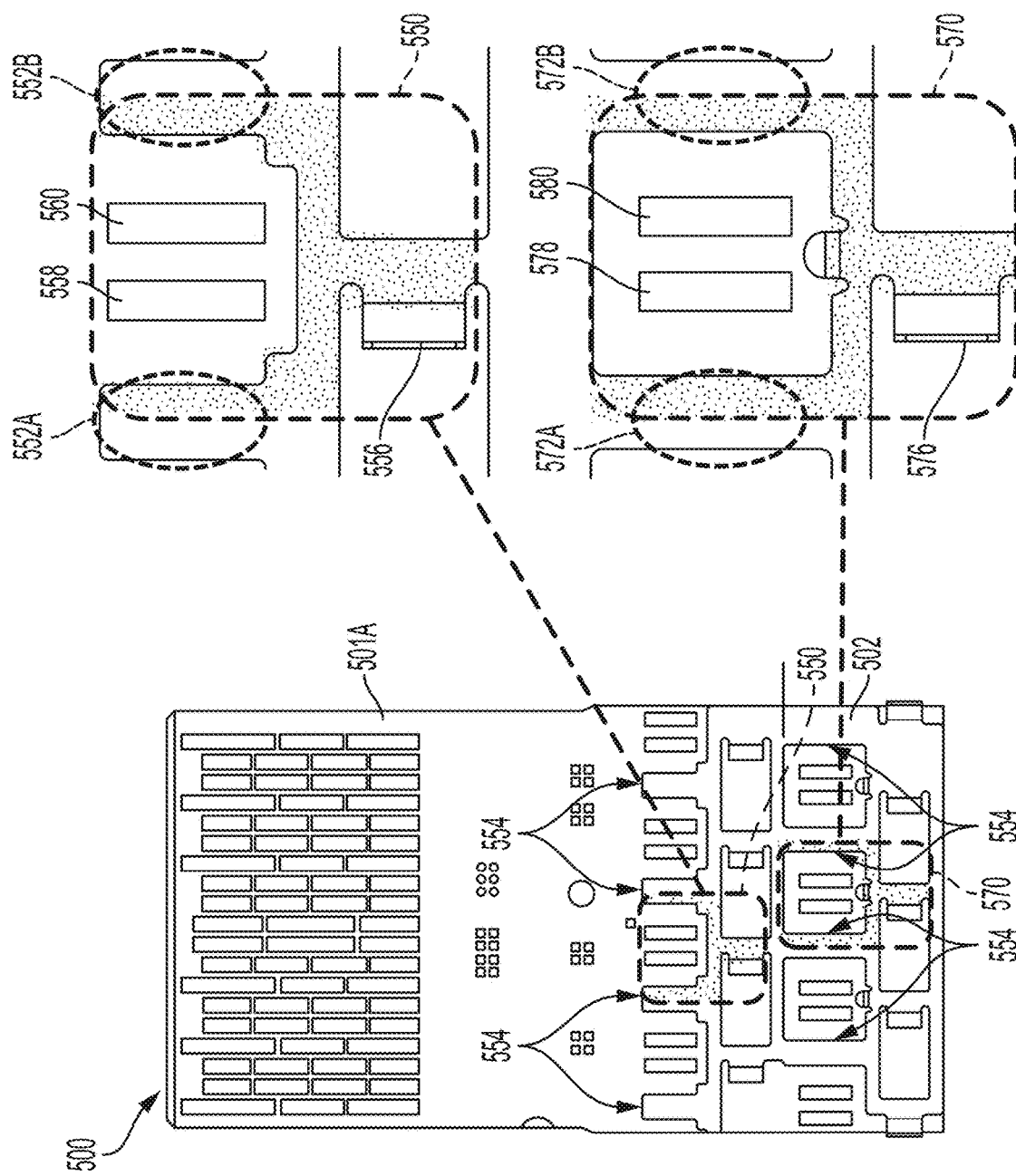
FIG. 5E is a top view of the exemplary paddle card with a conductive structure of FIG. 5A, with two portions broken out and enlarged.

FIG. 5E is a top view of the exemplary paddle card 500 with conductive structure 502 mounted to side 501A, in accordance with some embodiments. Like with FIG. 5B, since the conductive structure 502 is connected to the paddle card 500, the ground solder pads are not visible in FIG. 5B. FIG. 5E shows where the conductive structure 502 is electrically and physically connected to the ground solder pads 506 using arrows 554 (the dotted areas 508 used in FIG. 5B are not included in FIG. 5E for clarity and simplicity). The conductive structure 502 includes a plurality of portions that create separate ground paths for associated signal pads, two of which are shown as portion 550 and portion 570. Each portion is electrically and physically connected to a ground solder pad that is adjacent an associated pair of signal solder pads. For example, portion 550 is electrically and physically connected to ground solder pads at the portions shown by dotted areas 552A and 552B, and in particular the ground pad at area 552A is associated with the signal pads 558 and 560. Portion 570 is electrically and physically connected to ground solder pads at the portions shown by dotted areas 572A and 572B, and in particular the ground pad at area 572B is associated with the signal pads 578 and 580. Each portion also includes a tab that is aligned with the pair of signal pads, which, as is discussed in conjunction with FIGS. 6A-6B, is configured to make electrical contact with an exposed shield of a cable terminated to the respective pair of signal pads. For example, portion 550 includes tab 556 that is aligned with the pair of signal pads 558 and 560. Portion 570 includes tab 576 that is aligned with the pair of signal pads 578 and 580. Thus, in some embodiments, each portion can associate a return path from the paddle card to the cable that has its signal conductors electrically and physically connected to the pair of signal pads within the portion. As discussed further herein, when assembled, the tab aligned with the pair of signal pads folds over the shield of the wire to complete the conducting path between the shield of the cable and the ground structure within the paddle card via the portion of the conductive structure.

FIG. 6A is an isometric view of a portion of a cable assembly 600, in accordance with some embodiments. The cable assembly 600 includes a plurality of cables 602 (sixteen cables, in this illustrative example). The cable assembly 600 includes a paddle card 604 with two conductive structures 606 and 608. FIG. 6B is an isometric view of the portion of the cable assembly 600 where the cables 602 connect to the paddle card 604 and conductive structure 606. For each cable, the ends of the signal wires are soldered to respective signal solder pads. For example, for cable 602A, the end of the first signal wire 610A is soldered to a first signal solder pad, and the end of the second signal wire 610B is soldered to a second signal solder pad. The conductive structure 606 also includes a plurality of tabs 614, each of which is folded onto a shield of a respective cable. For example, tab 614A is folded onto the exposed shield of the cable 602A so that the tab is in physical and electrical contact with the shield. The tabs can be bent around the shields of the cables using, for example, a tool configured to sufficiently bend and press each of the tabs into physical and electrical contact with the shield without damaging the cable or conductive member (e.g., without crushing the cable). Pressing the tab in a shape to conform to that of the cable, with shield exposed, may provide adequate coupling between the conductive member and the shield of the cable. In other embodiments, an attachment material may be added, including conductive adhesive or solder.

As discussed in conjunction with FIG. 5E, the conductive structure includes a portion for each cable that provides a ground path for each cable. For example, the portion 612 of the conductive structure 606 creates a ground path for the cable 602A. These ground paths are largely or wholly disjoint, reducing crosstalk between cables. While not being bound by any particular theory of operation, the inventors believe that shaping the conductive structure in this way reduces mode conversion and impedance discontinuities. Ground paths that are largely or wholly disjoint is also believe to reduce crosstalk between cables. The conductive structure can be shaped to allow cables to connect to the paddle cards in different rows (e.g., one row with all transmit signals, and another row with receive signals). Using multiple rows can also help reduce the effect of crosstalk because cables can be grouped into rows by signal level (e.g., higher transmit signals can be grouped in one row, and lower receive signals can be grouped in another row) such that a further separation can be achieved between cables with different signal levels (e.g., to avoid crosstalk overwhelming lower signal cables). The ground paths through the conductive structure associated with cables in separate rows are completely disjoint, which provides good electrical separation between conductors most likely to generate harmful crosstalk (e.g. crosstalk from cables with higher signal levels in one row that could have a substantial impact on lower level signals carried by conductors in another row).

Figure 7:
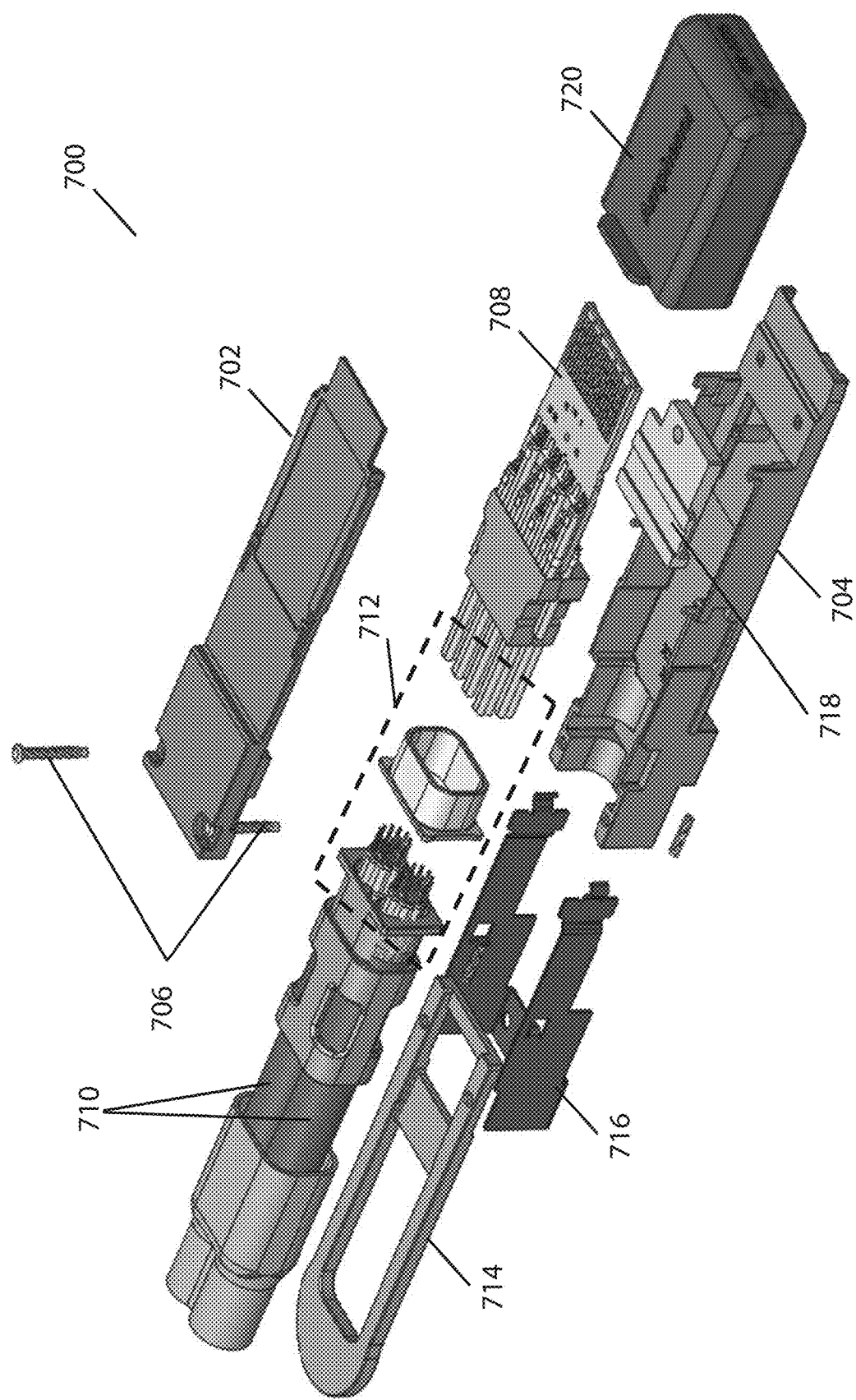
FIG. 7 is an isometric view of a cable assembly, partially cut away, in accordance with some embodiments.

FIG. 7 is an isometric view of a cable assembly 700, in accordance with some embodiments. The cable assembly 700 includes outer portions 702 and 704 of a plug housing, which are fixed to each other using screws 706. The outer portions 702 and 704 surround the paddle card 708, which includes the conductive structures and cable terminations, as discussed in conjunction with FIGS. 6A-6B. The cable assembly 700 includes two cable bundles 710. In region 712 signal wires and other portions of the cables of the cable assembly 700 have been cutaway for illustrative purposes. The cable assembly 700 also includes a tab 714 connected to latch release member 716, which can be pulled to release latches of a cage into which cable assembly 700 may be inserted to enable removal of the cable assembly 700 from the cage. The cable assembly 700 includes a stabilization portion 718, which is used to hold the cables relative to paddle card 708 so as to reduce strain on the cable terminations that might be caused by forces on the cable. Stabilization portion 718 may also provide a housing to facilitate mounting of paddle card 708 in the plug housing. The cable assembly 700 also includes a removable cap 720.

In some embodiments, connector modules may be attached to cables, creating cable assemblies that may be used to connect electronic devices. Each module may comprise one or more conductive members to terminate one or more cables in the manner described above. The modules may comprise mating contact portions configured to mate with mating contact portions in a mating connector. In the embodiment illustrated, the mating contact portions are rectangular and at the end of the paddle card. The mating contact portions may include signal and ground pads, and may be configured to mate with mating contact portions in a receptacle.

The plug of cable assembly 700 may mate with a receptacle connector mounted in an electronic device. For example, the receptacle connector may be mounted on a printed circuit board (PCB) in an electronic device. The cable assembly 700 may be configured to connect any suitable electronic device to any other suitable device, such as a first computer to a second computer, a computer to a server, and/or the like. The cable assembly 700, including the cables of the cable bundles 710, may have characteristics selected for the types of signals to pass between the connected devices.

FIG. 8A is an isometric view of an exemplary paddle card 800 with conductive structures 802, in accordance with some embodiments. In contrast to the embodiment of FIG. 5A, for example, in which the conductive structure on each surface of a paddle card was a unitary member, the conductive structure in the embodiment of FIG. 8A has conductive structures formed from multiple separate members attached to each surface of the paddle card.

The first side 806 of the paddle card 800 has four conductive structures 802. While not shown, the opposite side (the bottom side opposite side 806) also has four conductive structures 802, in the illustrated embodiment. The paddle card 800 includes solder pads 804, which are in a first row 808 and a second row 810. The first row 808 and second row 810 extend along a second direction 814 orthogonal to the first direction 812 and are spaced in the first direction 812. The conductive structures 802 are electrically and physically connected to the paddle card 800 such that two conductive structures 802 are in a third row 816 and two conductive structures 802 are in a fourth row 818. The third row 816 and fourth row 818 extend along the second direction 814 and are spaced from each other along the first direction 812. The conductive structures 802 are electrically and physically connected to the paddle card 800 through respective ground pads in rows 816 and 818. Alternatively, each conductive structure 802 may be electrically and physically connected to the paddle card 800 through a single ground pad. In some embodiments, each conductive structure 802 is electrically and physically connected to the paddle card 800 through a plurality of ground pads.

Each conductive structure 802 includes tabs disposed along the row to which the conductive structure 802 is electrically and physically connected. For example, conductive structure 802A includes four tabs 820A-D along row 818. Tabs 820A and 820D are each formed at a respective end of the conductive structure 802A, and are U-shaped. Tabs 820B and 820C include single fingers formed at the interior of the conductive structure 802A. The tabs of the conductive structures 802 extend upwards in a direction orthogonal to the surface of the first side 806. The tabs of the conductive structures 802 include a width that extends along the first direction 812.

Each conductive structure 802 includes a plurality of portions, such as portion 840 (e.g., two portions). Each portion connects to a ground pad of the ground pad structure of the paddle card 800. Each portion is associated with a pair of signal pads (e.g., signal pads 804A and 804B for portion 840) to which a pair of signal conductors are connected. Each portion is connected to the shield of the cable terminated to that pair of signal pads, including by the finger tab and U-shaped tab of the portion. The portions may be configured such that crosstalk is low where the cables are terminated to the PCB, leading to low crosstalk in the cable assembly.

FIG. 8B is an isometric view of the exemplary paddle card 800 with conductive structures 802 and cables 850. As discussed herein, the tabs of the conductive structures are configured for electrical and physical connection to the shield of a cable. The conductive structures 802 are shown in FIG. 8B both prior to connection to the conductive shield of the cables as well as after connection to the shield of the cables. For example, conductive structure 802B is shown prior to connection of its associated tabs to the conductive shields of cables 850A and 850B, while conductive structure 802A is shown with its associated tabs 820A-820D in physical and electrical contact with the conductive shields of cables 850C and 850D. As shown for conductive structure 802A, each pair of neighboring U-shaped tabs and single finger tabs (e.g., the pair of U-shaped tab 820A and single finger tab 820B) are configured for connection to a same cable, such that when the pair of tabs are folded around a cable, the single finger tab is disposed within the U-shaped tab.

Each of the conductive structures 802 includes a space portion separating the tabs of each pair, such as the space 822 between tabs 820C and 820D shown in FIG. 8A. The space portions separating the tabs of each pair are sized sufficiently wide enough in the second direction 814 to accommodate a cable, as shown in FIG. 8B (e.g., with the cable 850D disposed between the tabs 820C and 820D). Each of the conductive structures 802 also includes a space portion (e.g., the space portion 822 of conductive structure 802A in FIG. 8A) disposed between the two pairs of tabs. The space portion between the pairs of tabs is sized sufficiently wide enough in the second direction 814 to allow a cable to pass there between, depending on the row (e.g., rows 816 or 818) in which the conductive structure is mounted to the paddle card. For example, as shown in FIGS. 8A and 8B, the conductive structures 802 in row 816 include cables that pass through the conductive structure without connecting to the conductive structure, so that the cables can be mounted to the paddle card in parallel, in a manner such that neighboring cables connect to solder pads in different rows (e.g., rows 808 or 810).

While not shown in FIGS. 6A-8B, in some embodiments a securing member can be included in the cable assembly to maintain the tabs in electrical and physical communication with the cable shields (e.g., as part of the connector). The securing member can be sized sufficient to maintain the tabs in electrical and physical communication with the cables without damaging the cables and/or tabs. The securing member can be made of a dielectric material, such as a plastic or rubber material.

Various types of cables and/or cable bundles may be used with the techniques discussed herein. The inventors have discovered techniques that enable using a lower gauge wire, which will have less loss in the cables, while still maintaining the same (if not smaller) cross-sectional area when compared to cables with higher gauge signal conductors. For example, for as the frequency of a signal passing through a cable is increased, the attenuation of that signal may also increase. Thus, while a lower gauge wire may be larger than a higher gauge wire, it can allow for higher frequency applications or longer cable assemblies because the lower gauge wire can provide better attenuation at such frequencies.

The cable assemblies described herein can be designed to achieve cables of certain lengths that provide certain cable properties (e.g., impedance, frequency operation, loss, etc.) even when the space available for terminating the cables is constrained by standards that lead to paddle cards of limited width. For example, it may be desirable to provide three (3) meter long end-to-end 100 ohm cables with only 17 dB of loss via the use of 25 or 27 AWG signal conductors. The configuration of the cables and/or cable bundle can be designed to achieve such cable properties and such cables may be terminated to a paddle card of limited width using techniques as described herein. In some embodiments, the cables may be constructed without drain wires and the size and type of dielectric material around the signal conductors may be selected to provide cables of a width that may be terminated to a paddle card in accordance with a high density standard. It should be appreciated, however, that the size of the dielectric material cannot be arbitrarily changed to meet mechanical (e.g. size) requirements of a standard because selection of a material size may impact other cable properties, such as impedance. Nonetheless, the inventors have achieved desired size and electrical characteristics of cable assemblies using techniques as described herein.

Figure 9B:
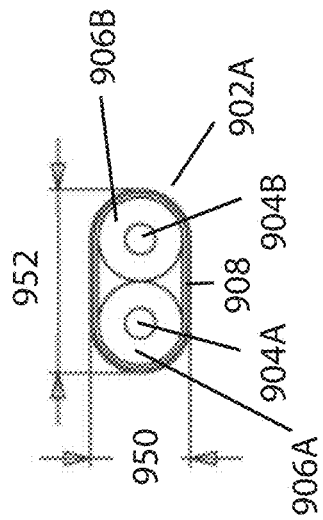
FIG. 9B shows an exemplary cross-sectional view of a cable of the cable bundle of FIG. 9A, according to some embodiments.
Figure 9A:
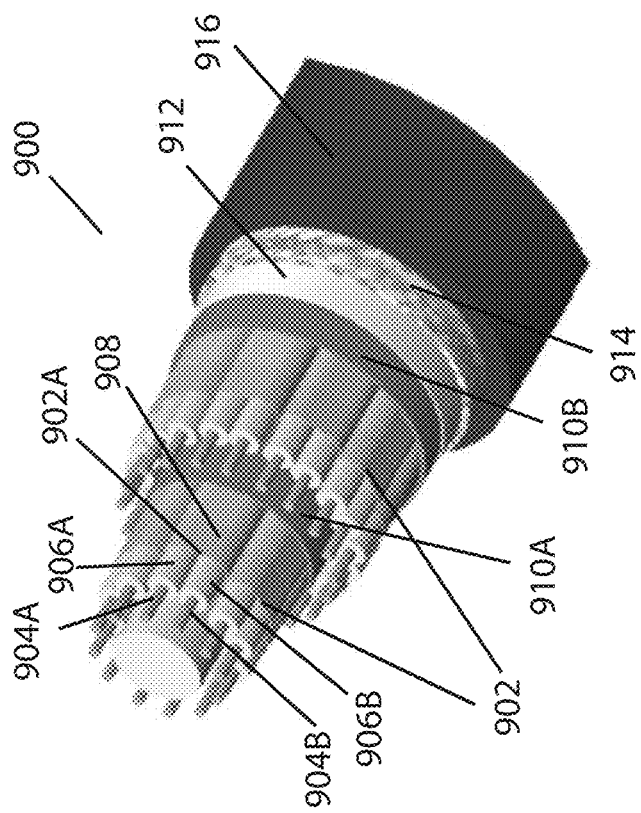
FIG. 9A show a first exemplary cable bundle, according to some embodiments.

FIGS. 9A-9B show a first exemplary cable bundle 900, according to some embodiments. The cable bundle 900 includes eight cables 902, each with a respective pair of signal conductors. For example, cable 902A includes signal conductors 904A and 904B. The signal conductors may be made of various conductive materials. For example, the signal conductors may be made of copper, silver, gold, a plated copper (e.g., silver plated copper), a copper alloy (e.g., such as copper-zinc, copper-nickel, copper-magnesium, copper-iron, etc.) and/or the like. The signal conductors may be of various gauges, such as a gauge ranging from approximately 34-27 AWG. For example, for a cable assembly that meets the QSFP-DD standard, the wires may be 34-27 AWG (e.g., where otherwise the signal conductors are often 34-25 AWG, or higher).

Each signal conductor is surrounded by a dielectric material. For example, the signal conductors 904A and 904B of cable 902A are each surrounded by a dielectric material 906A and 906B, respectively. The dielectric material may be made of any dielectric, such as a polymer (e.g., a foamed fluorinated polymer).

For each cable, the signal conductors and associated dielectrics are surrounded by a conductive foil. For example, the cable 902A surrounds the signal conductors 904A, 904B and associated dielectric materials 906A, 906B, with conductive foil 908. The conductive foil may be made of any conductive material, such as aluminum, an aluminum coated polyester (e.g., aluminized Mylar), a wire braid, and/or the like. The conductive foil may also include an additional layer over the conductive foil, such as a clear polyester layer.

Various groups of cables and/or layers of cables may be surrounded by a buffer. For example, in the cable bundle 900, two buffers 910A and 910B are included. The buffer may be made out of a tape, such as polyolefin or polyester tape. Each cable bundle may include one or more outer shields. Cable bundle 900 includes an inner shield 912 and an outer shield 914. The inner shield 912 may be made of a conductive material, such as aluminum, an aluminum coated polyester, or the like. The outer shield 914 may be made of a braided material, such as a copper braid, a tinned copper braid, or the like. The wires used in the braid may be of various gauges, such as 36-40 AWG, such as 38 AWG. The outer jacket 916 may be a protective material, such as PVC, polyester or the like.

As shown in FIG. 9B for exemplary cable 902A, the signal conductors 904A, 904B, dielectric material 906A, 906B, conductive foil 908 and outer coating (e.g., clear polyester, if present), may be configured to achieve certain dimensions for each cable. The first dimension 950 in the vertical direction may be in the range of 1.25-1.6 millimeters, such as 1.40 millimeters. The second dimension 952 in the horizontal direction may be 2.5-2.7 millimeters, such as 2.62 millimeters. Cables designed as shown in FIG. 9A-9B may achieve, for example, an impedance of 100 ohms and support signals of up to 23 GHz.

FIGS. 10A-10B show a second exemplary cable bundle 1000, according to some embodiments. The cable bundle 1000 includes eight cables 1002, each with a respective pair of signal conductors. Similar to the cables in FIGS. 9A-9B, cable 1002A includes signal conductors 1004A and 1004B, dielectric material 906A and 906B, conductive foil 1008, buffers 1010A and 1010B, inner shield 1012 and an outer shield 1014, and outer jacket 916. The signal conductors in the exemplary able bundle 1000 may be a gauge of approximately 25-34 AWG, such as 27 AWG.

As shown in FIG. 10B for exemplary cable 1002A, the signal conductors 1004A, 1004B, dielectric material 1006A, 1006B, conductive foil 1008 and outer coating (e.g., clear polyester, if present), may be configured to achieve certain dimensions for each cable. The first dimension 1050 in the vertical direction may be 1.05-1.25 millimeters, such as 1.17 millimeters. The second dimension 1052 in the horizontal direction may be 2.05-2.25 millimeters, such as 2.16 millimeters. Cables designed as shown in FIG. 10A-10B may achieve, for example, an impedance of 100 ohms and support signals up to 23 GHz.

The techniques disclosed herein can be used, for example, for data rate applications specified by the IEEE802.3cd 56 Gbps/lane PAM4 Ethernet Standard, which is hereby incorporated by reference herein in its entirety. An external I/O cable assembly, with a test card using conductive structures as discussed herein, was built in compliance with the IEEE802.3cd standard for testing. The test card signal conductors were 27 AWG, and the test card was compliant with QSFP-DD. The test card used two ground clips, one on each side of the paddle card.

Figure 11:
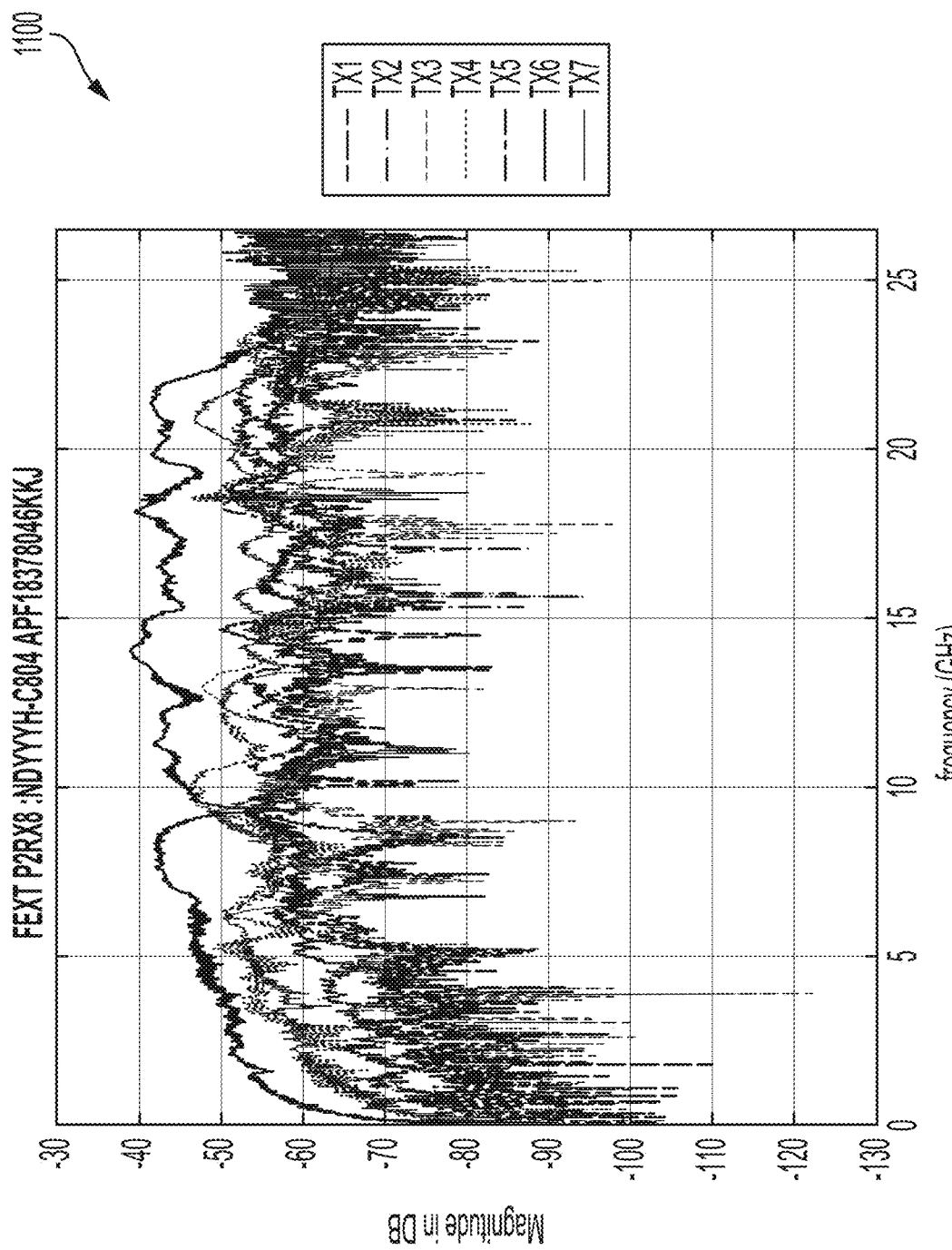
FIG. 11 is a performance plot showing far-end crosstalk for a cable assembly, according to some embodiments.

FIG. 11 is a performance plot 1100 showing the far-end crosstalk (FEXT) for the test assembly, according to some embodiments. The performance plot 1100 shows FEXT for the eighth receive line (RX8) for side P2 (one of the end of the cable assembly, where P1 refers to the other end of the cable assembly) when each of the first through the seventh transmit lines (TX1 through TX7) are driven. The performance plot 1100 shows plots for TX1 through TX7 at a frequency ranging from 0-26.5 GHz. As shown in the plot 1100, the FEXT of the transmit lines is substantially less than 40 dB over a frequency range of 0-26.5 GHz (e.g., for over 90% of the frequency range), with crosstalk for most of the transmit lines being less than 40 dB over the range. The worst case crosstalk, for TX1, exceeds 40 dB by only a few dB (e.g. less than 2) for a small subrange of the frequencies.

Figure 12:
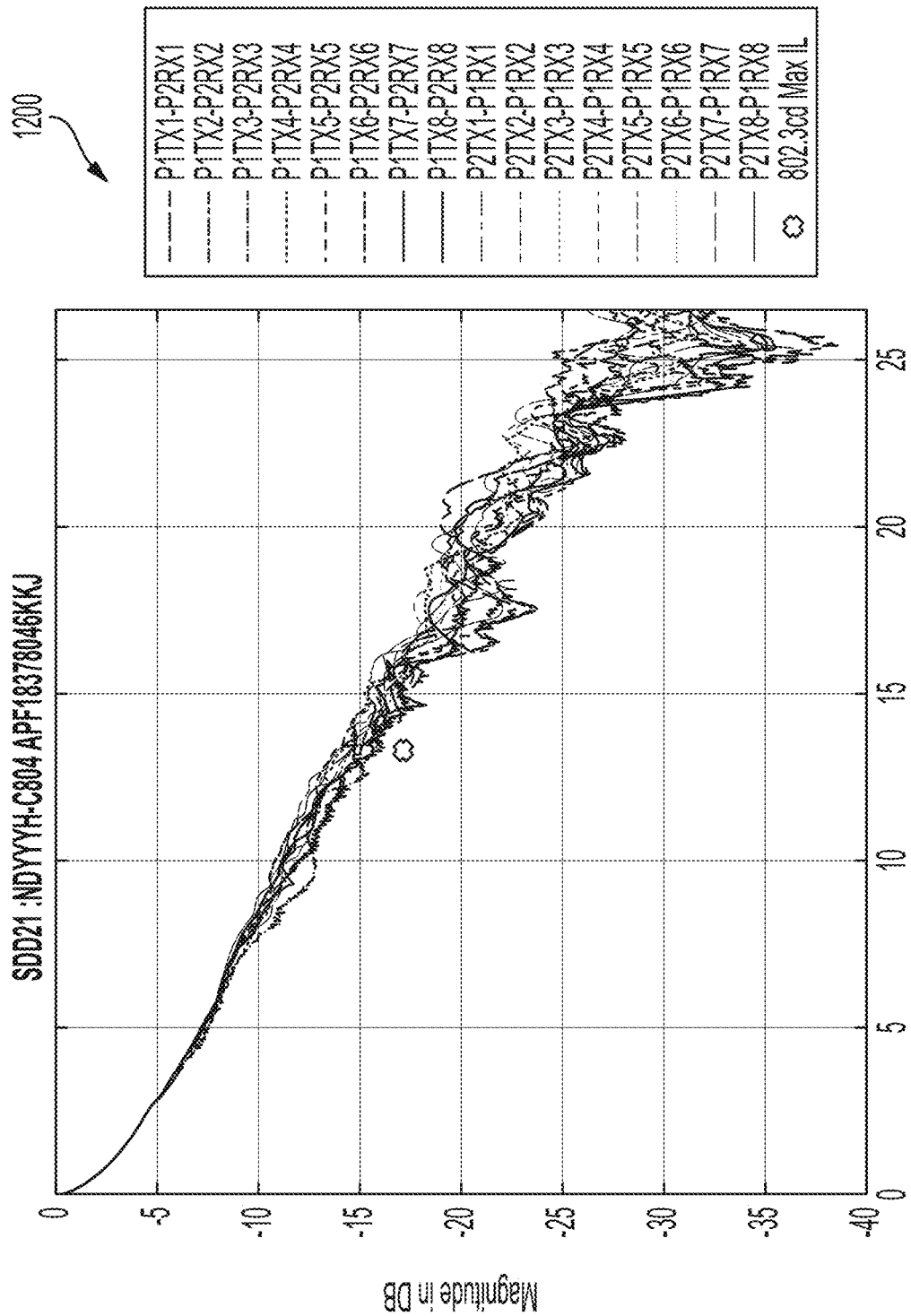
FIG. 12 is a performance plot showing insertion loss for a cable assembly, according to some embodiments.

FIG. 12 is a performance plot 1200 showing the differential insertion loss (SDD21), or insertion loss (IL), for the test assembly, according to some embodiments. The performance plot 1200 shows IL for lines 1-8 when transmitting from both side P1 to side P2 as well as from side P2 to P1. For example, P1TX1-P2RX1 shows the differential insertion loss from side P1 on TX1 to the RX end of line TX1 at side P2 (P2RX1). As another example, P2TX1-P1RX1 represents a transmission from side P2 on TX1 to side P1, which is the RX end of line TX1 (P1RX1)). The performance plot

1200 shows traces for each transmission at a frequency range from 0-27 GHz. The performance plot 1200 also shows the 802.3cd Max IL. As shown in plot 1200, for both transmit and receive signaling, the IL increases as the frequency increases, starting at around 0 and increasing to an IL ranging between approximately 27-36 dB, with one line showing an IL that exceeds that by a small amount (e.g. a few dB) around 25 GHz.

Crosstalk and IL as shown in FIGS. 11-12 reveal a cable assembly well suited for use for high frequency signals, including those in the range of 0-27 GHz, in an assembly with multiple lanes, such as those that meet the OSFP or QSFP-DD standards. Such cable assemblies may, for example, meet the QSFP-DD standard with 27 AWG signal conductors that are 2.5 meters with end to end attenuation of less than 17 dB. As another example, a cable assembly may meet the OSFP standard with 25 AWG signal conductors that are 3.0 meters with end to end attenuation of less than 17 dB.

Having thus described several aspects of at least one embodiment of this invention, it is to be appreciated that various alterations, modifications, and improvements will readily occur to those skilled in the art.

For example, embodiments are described that meet the requirements of OSFP and QSFP-DD standards. Techniques as described herein may be applied to cable assemblies that meet other standards or are custom configurations that are not designed for specific standards.

Similarly, embodiments are described for use with double density configurations in which contact pads on a paddle card are arrayed in two rows. The same techniques may be used in other configurations, including with paddle cards with a single row or more than two rows of contact pads and/or solder pads.

As another example, a round cable bundle is illustrated. Techniques as described herein may be used with ribbon cables or cable bundles in other configurations. Likewise, cables are described as having two signal conductors that are wrapped with a shield. Other cable configurations may be used, such as ribbon cables in which two shielding films are pinched on either side of each of multiple sets of signal conductors.

Such alterations, modifications, and improvements are intended to be part of this disclosure, and are intended to be within the spirit and scope of the invention. Further, though advantages of the present invention are indicated, it should be appreciated that not every embodiment of the invention will include every described advantage. Some embodiments may not implement any features described as advantageous herein and in some instances. Accordingly, the foregoing description and drawings are by way of example only.

Various aspects of the present invention may be used alone, in combination, or in a variety of arrangements not specifically discussed in the embodiments described in the foregoing and is therefore not limited in its application to the details and arrangement of components set forth in the foregoing description or illustrated in the drawings. For example, aspects described in one embodiment may be combined in any manner with aspects described in other embodiments.

Also, the invention may be embodied as a method, of which an example has been provided. The acts performed as part of the method may be ordered in any suitable way. Accordingly, embodiments may be constructed in which acts are performed in an order different than illustrated, which may include performing some acts simultaneously, even though shown as sequential acts in illustrative embodiments.

Also, circuits and modules depicted and described may be reordered in any order, and signals may be provided to enable reordering accordingly.

Computer-executable instructions may be in many forms, such as program modules, executed by one or more computers or other devices. Generally, program modules include routines, programs, objects, components, data structures, etc. that perform particular tasks or implement particular abstract data types. Typically, the functionality of the program modules may be combined or distributed as desired in various embodiments.

Also, data structures may be stored in non-transitory computer-readable storage media in any suitable form. For simplicity of illustration, data structures may be shown to have fields that are related through location in the data structure. Such relationships may likewise be achieved by assigning storage for the fields with locations in a non-transitory computer-readable medium that convey relationship between the fields. However, any suitable mechanism may be used to establish relationships among information in fields of a data structure, including through the use of pointers, tags or other mechanisms that establish relationships among data elements.

Use of ordinal terms such as "first," "second," "third," etc., in the claims to modify a claim element does not by itself connote any priority, precedence, or order of one claim element over another or the temporal order in which acts of a method are performed, but are used merely as labels to distinguish one claim element having a certain name from another element having a same name (but for use of the ordinal term) to distinguish the claim elements.

All definitions, as defined and used herein, should be understood to control over dictionary definitions, definitions in documents incorporated by reference, and/or ordinary meanings of the defined terms.

The indefinite articles "a" and "an," as used herein in the specification and in the claims, unless clearly indicated to the contrary, should be understood to mean "at least one."

As used herein in the specification and in the claims, the phrase "at least one," in reference to a list of one or more elements, should be understood to mean at least one element selected from any one or more of the elements in the list of elements, but not necessarily including at least one of each and every element specifically listed within the list of elements and not excluding any combinations of elements in the list of elements. This definition also allows that elements may optionally be present other than the elements specifically identified within the list of elements to which the phrase "at least one" refers, whether related or unrelated to those elements specifically identified.

The phrase "and/or," as used herein in the specification and in the claims, should be understood to mean "either or both" of the elements so conjoined, i.e., elements that are conjunctively present in some cases and disjunctively present in other cases. Multiple elements listed with "and/or" should be construed in the same fashion, i.e., "one or more" of the elements so conjoined. Other elements may optionally be present other than the elements specifically identified by the "and/or" clause, whether related or unrelated to those elements specifically identified. Thus, as a non-limiting example, a reference to "A and/or B", when used in conjunction with open-ended language such as "comprising" can refer, in one embodiment, to A only (optionally including elements other than B); in another embodiment, to B only (optionally including elements other than A); in yet another embodiment, to both A and B (optionally including other elements); etc.

As used herein in the specification and in the claims, "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," or, when used in the claims, "consisting of," will refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of." "Consisting essentially of," when used in the claims, shall have its ordinary meaning as used in the field of patent law.

Also, the phraseology and terminology used herein is for the purpose of description and should not be regarded as limiting. The use of "including," "comprising," or "having," "containing," "involving," and variations thereof herein, is meant to encompass the items listed thereafter and equivalents thereof as well as additional items.

What is claimed is:

1. A cable assembly comprising:
   a paddle card comprising a planar surface, wherein the paddle card comprises a first plurality of pads and a second plurality of pads on the planar surface;
   a plurality of cables, wherein each cable of the plurality of cables comprises at least one conductor and a shield foil, wherein conductors of the at least one conductor are electrically and mechanically connected to pads of the first plurality of pads;
   at least one conductive structure electrically and physically connected to pads of the second plurality of pads, wherein:
     the at least one conductive structure comprises a second surface adjacent to and parallel to the planar surface of the paddle card and a plurality of tabs extending from the second surface; and
     each tab of the plurality of tabs at least partially wraps around a respective cable of the plurality of cables and is electrically connected to the shield foil of the respective cable.

2. The cable assembly of claim 1, wherein:
   the first and second plurality of pads comprises pairs of neighboring signal pads and ground pads disposed between adjacent pairs of signal pads;
   each cable of the plurality of cables comprises two conductors, wherein the two conductors of each cable are mounted to a respective pair of neighboring signal pads;
   the at least one conductive structure comprises a plurality of portions, each portion:
     being electrically and physically connected to a ground pad of the set of pads adjacent a respective pair of signal pads of the set; and
     comprising a tab of the plurality of tabs aligned with the respective pair of signal pads so as to make electrical contact with an exposed shield of a cable terminated to the respective pair of signal pads.

3. The cable assembly of claim 1, wherein:
   an end of the cable comprises an exposed portion of the shield foil; and
   the shield surrounds, at least in part, the at least one conductor.

4. The cable assembly of claim 1, wherein each cable of the plurality of cables is a twinax cable without a drain wire.

5. The cable assembly of claim 1, wherein:
   the paddle card comprises a length that extends along a first direction;
   the first and second plurality of pads are disposed in a first row and a second row, wherein the first row and the second row extend along a second direction orthogonal to the first direction, and the first row is spaced from the second row in the first direction;
   the cables of the plurality of cables are aligned in parallel in the first direction and disposed side-by-side in the second direction; and
   the plurality of cables are electrically and physically connected in an alternating fashion such that conductors of neighboring cables of the plurality of cables are electrically and mechanically connected to pads of the first plurality of pads in different rows of the first and second rows.

6. The cable assembly of claim 5, wherein:
   cables of the plurality of cables with conductors electrically and mechanically connected to pads of the first plurality of pads in the first row are configured to pass signals in a first direction; and
   cables of the plurality of cables with conductors electrically and mechanically connected to pads of the first plurality of pads in the second row are configured to pass signals in a second direction different than the first direction.

7. The cable assembly of claim 1, wherein:
   the paddle card comprises a length that extends along a first direction;
   the paddle card comprises a width that extends along a second direction orthogonal to the first direction, wherein the width is between 13.25 and 19.75 millimeters.

8. The cable assembly of claim 7, wherein:
   the plurality of cables comprises eight twinax cables; and
   the at least one conductor of each cable of the plurality of cables comprises a gauge ranging between 34 American Wire Gauge (AWG) to 25 AWG.

9. The cable assembly of claim 1, wherein:
   the paddle card comprises a length that extends along a first direction;
   the paddle card comprises a width that extends along a second direction orthogonal to the first direction, wherein the width is between 22 and 27 millimeters.

10. The cable assembly of claim 9, wherein:
    the plurality of cables comprises eight twinax cables; and
    the at least one conductor of each cable of the plurality of cables comprises a gauge ranging between 34 American Wire Gauge (AWG) to 25 AWG.

11. The cable assembly of claim 1, wherein the electrical connection of the plurality of tabs of the at least one conductive structure to the shield foil of each cable suppresses crosstalk between the cables of the plurality of cables.

12. The cable assembly of claim 11, wherein a far end crosstalk of the plurality of cables is less than 35 dB over a frequency range of 1 to 20 GHz.

13. The cable assembly of claim 11, wherein a far end crosstalk of the plurality of cables is less than 40 dB substantially over a frequency range of 1 to 20 GHz.

14. The cable assembly of claim 1, wherein the plurality of cables comprise:

a length ranging from 2.5 meters to 3.5 meters;
an impedance of 100 ohms; and
end to end attenuation of less than 17 db.

15. The cable assembly of claim 1, wherein the at least one conductive structure comprises a plurality of contiguous openings, wherein each contiguous opening of the plurality:
   extends along the planar surface in a first direction and a second direction; and
   surrounds at least one pad from second plurality of pads, such that the at least one conductive structure is not in mechanical contact with the second plurality of pads.

16. The cable assembly of claim 1, wherein:
   the paddle card comprises a ground structure within the paddle card; and
   the at least one conductive structure is electrically connected to the ground structure via the second plurality of pads.

17. A cable assembly comprising:
   a paddle card comprising a first edge, a plurality of mating contacts adjacent the first edge, a surface, a plurality of pads on the surface, and a ground structure within the paddle card;
   a plurality of cables, wherein each cable of the plurality of cables comprises at least one conductor and a shield foil;
   at least one conductive structure electrically coupled to the ground structure within the paddle card and electrically and mechanically coupled to the shield foil of a respective cable, the at least one conductive structure comprising a second surface adjacent to and parallel to the surface of the paddle card,
   wherein:
      the mating contacts are elongated in a first direction orthogonal to the first edge;
      the plurality of pads are disposed in a first row and a second row;
      the first row and the second row extend along a second direction orthogonal to the first direction, and the first row is spaced from the second row in the first direction;
      the first and second rows are in a region between the first edge and a second edge opposite the first edge; and
      the first and second rows comprise sets of pads that each comprise a pair of signal pads of the plurality of pads; and
      the plurality of cables comprises a first subset and a second subset, with the at least one conductor of the cables in the first subset electrically and mechanically connected to pads of the plurality of pads in the first row and the at least one conductor of the cables in the second subset electrically and mechanically connected to pads of the plurality of pads in the second row.

18. The cable assembly of claim 17, wherein:
   the mating contacts comprise signal contact pads, wherein each signal contact pad is in electrical communication with an associated signal pad of the plurality of pads; and
   ground contact pads, wherein each ground contact pad is in electrical communication with an associated ground pad of the plurality of pads.

19. The cable assembly of claim 17, wherein the sets of pads of the first and second rows each further comprise a ground pad of the plurality of pads adjacent the pair of signal pads.

20. The cable assembly of claim 19, wherein the at least one conductive structure is electrically connected to the ground structure via the ground pads of the first and second rows.

21. The cable assembly of claim 17, wherein the at least one conductive structure comprises a plurality of openings, wherein each opening of the plurality:
   extends along the surface in the first direction and the second direction; and
   is shaped to surround a pair of signal pads in the first row or the second row on at least three sides.

22. A cable assembly comprising:
   a paddle card comprising a surface, wherein the paddle card comprises a ground structure within the paddle card, a plurality of pads on the surface, and a plurality of openings in the surface;
   a plurality of cables, wherein each cable of the plurality of cables comprises at least one conductor and a shield foil, wherein conductors of the at least one conductor are electrically and mechanically connected to pads of the plurality of pads;
   at least one conductive structure comprising a second surface adjacent to and parallel to the surface of the paddle card and a plurality of tabs extending from the second surface, wherein:
      each tab of the plurality of tabs at least partially wraps around a respective cable of the plurality of cables and is electrically connected to the shield foil of the respective cable; and
      the at least one conductive structure comprises a plurality of protrusions that extend into corresponding openings of the plurality of openings, whereby the conductive structure is electrically connected to the ground structure within the paddle card.

* * * * *